(12) United States Patent
Hwang et al.

(10) Patent No.: US 10,438,800 B2
(45) Date of Patent: Oct. 8, 2019

(54) SEMICONDUCTOR DEVICES AND METHODS OF FABRICATING THE SAME

(71) Applicant: Samsung Electronics Co., Ltd., Suwon-si, Gyeonggi-do (KR)

(72) Inventors: Yoon Tae Hwang, Seoul (KR); Moon Kyun Song, Anyang-si (KR); Nam Gyu Cho, Seoul (KR); Kyu Min Lee, Hwaseong-si (KR); Soo Jung Choi, Seoul (KR); Yong Ho Ha, Hwaseong-si (KR); Sang Jin Hyun, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/825,135

(22) Filed: Nov. 29, 2017

(65) Prior Publication Data

US 2018/0261460 A1  Sep. 13, 2018

(30) Foreign Application Priority Data

Mar. 13, 2017 (KR) ........................ 10-2017-0031294

(51) Int. Cl.
*H01L 21/28* (2006.01)
*H01L 29/51* (2006.01)
(Continued)

(52) U.S. Cl.
CPC ........ *H01L 21/28185* (2013.01); *B82Y 10/00* (2013.01); *H01L 21/022* (2013.01); *H01L 21/0228* (2013.01); *H01L 21/02164* (2013.01); *H01L 21/02532* (2013.01); *H01L 21/28176* (2013.01); *H01L 21/82385* (2013.01); *H01L 21/823821* (2013.01); *H01L 21/823842* (2013.01); *H01L 21/823857* (2013.01); *H01L 27/092* (2013.01); *H01L 27/0924* (2013.01);
(Continued)

(58) Field of Classification Search
None
See application file for complete search history.

(56) References Cited

U.S. PATENT DOCUMENTS 6,974,779 B2  12/2005  O'Meara et al.
8,313,994 B2  11/2012  Clark
(Continued)

FOREIGN PATENT DOCUMENTS

JP   2011-103329   5/2011
KR   20010004972   1/2001

*Primary Examiner* — Mounir S Amer
(74) *Attorney, Agent, or Firm* — Myers Bigel, P.A.

(57) ABSTRACT

Semiconductor devices and methods for fabricating the same are provided. A semiconductor device may include a substrate including first and second regions, a first interface film disposed on the substrate in the first region, a second interface film disposed on the substrate in the second region, a dielectric film disposed on the first and second interface films, a first metal film disposed on the dielectric film in the first region, and a second metal film disposed on the dielectric film in the second region. The first and second interface films may comprise an oxide of the substrate, the first and second metal films may comprise different materials, and the first and second interface films may have different thicknesses. Channels may be provided in the first and second regions, and the channels may be fin-shaped or wire-shaped. The metal films may have different oxygen content.

16 Claims, 20 Drawing Sheets

(51) Int. Cl.
    *H01L 21/02*     (2006.01)
    *H01L 21/8238*     (2006.01)
    *H01L 27/092*     (2006.01)
    *H01L 29/423*     (2006.01)
    *H01L 29/49*     (2006.01)
    *H01L 29/775*     (2006.01)
    *B82Y 10/00*     (2011.01)
    *H01L 29/06*     (2006.01)
    *H01L 29/786*     (2006.01)
    *H01L 29/78*     (2006.01)

(52) U.S. Cl.
    CPC .... *H01L 29/0673* (2013.01); *H01L 29/42364* (2013.01); *H01L 29/42392* (2013.01); *H01L 29/4966* (2013.01); *H01L 29/513* (2013.01); *H01L 29/517* (2013.01); *H01L 29/775* (2013.01); *H01L 29/78696* (2013.01); *H01L 21/02238* (2013.01); *H01L 21/02576* (2013.01); *H01L 21/02579* (2013.01); *H01L 21/28194* (2013.01); *H01L 29/7848* (2013.01)

(56) References Cited

U.S. PATENT DOCUMENTS

| | | | |
|---|---|---|---|
| 8,575,038 B2 | 11/2013 | Umezawa et al. | |
| 9,281,310 B2 | 3/2016 | Ji et al. | |
| 2011/0115027 A1* | 5/2011 | Jagannathan | H01L 21/28088 257/369 |
| 2015/0221559 A1* | 8/2015 | Kang | H01L 21/823842 257/369 |
| 2015/0380519 A1 | 12/2015 | Zhao | |

* cited by examiner

SEMICONDUCTOR DEVICES AND METHODS OF FABRICATING THE SAME

This application claims all benefits of priority under 35 U.S.C. § 119 to Korean Patent Application No. 10-2017-0031294, filed on Mar. 13, 2017, the disclosure of which is incorporated herein by reference in its entirety.

BACKGROUND

Technical Field

The present disclosure relates to semiconductor devices and methods of fabricating the same, and more particularly, to semiconductor devices including interface films and methods of fabricating the semiconductor devices.

Description of the Related Art

As the density of semiconductor devices increases, various efforts have been made to improve the performance of transistors by using a variety of materials and elements such as a strained channel, a high-k film, a metal gate, and the like. An interface film, in particular, can be interposed between a channel and a high-k film to reduce/prevent interface error.
Multi-gate transistors using three-dimensional (3D) channels have been developed as a scaling technique for improving the density of semiconductor devices. The multi-gate transistors can improve current control capability without the need to increase the length of gates. Also, a short channel effect (SCE), which is a phenomenon in which the potential of a channel region is affected by a drain voltage, can be effectively suppressed.

SUMMARY

Aspects of the present disclosure provide semiconductor devices capable of improving performance using interface films having different thicknesses or channels having different cross-sectional areas, as desired.

Aspects of the present disclosure also provide methods of fabricating semiconductor devices capable of improving performance using interface films having different thicknesses or channels having different cross-sectional areas, as desired.

According to aspects of the present disclosure, a semiconductor device may be provided. The semiconductor device may include a substrate with first and second regions, a first interface film disposed on the substrate in the first region, a second interface film disposed on the substrate in the second region, a dielectric film disposed on the first and second interface films, a first metal film disposed on the dielectric film in the first region, and a second metal film disposed on the dielectric film in the second region. The first and second interface films may include an oxide of the substrate, the first and second metal films may include different materials, and the first and second interface films may have different thicknesses.

According to aspects of the present disclosure, a semiconductor device may be provided. The semiconductor device may include a substrate having first and second regions, a first interface film disposed on the substrate in the first region, a second interface film disposed on the substrate in the second region, a dielectric film disposed on the first and second interface films, a first metal film disposed on the dielectric film in the first region, and a second metal film disposed on the dielectric film in the second region. The first and second interface films may include an oxide of the substrate, a thickness of the second metal film may be greater than a thickness of the first metal film, and a thickness of the second interface film may be greater than a thickness of the first interface film.

According to aspects of the present disclosure, a semiconductor device, including first and second regions, may be provided. The first region may be of a first conductivity type and the second region may be of a second conductivity type. The semiconductor device may include first and second interface films of different thicknesses comprising an oxide of the substrate and respectively disposed in the first and second regions. The semiconductor device may include a dielectric film disposed on the first and second interface films, and first and second metal films of different thicknesses disposed on the dielectric film. The first and second metal films may have different oxygen content. The first film may be disposed on the dielectric film in the first region and the second metal film may be disposed on the dielectric film in the second region.

However, aspects of the present disclosure are not limited to those set forth in this summary, which is provided for illustrative purposes only. The above and other exemplary embodiments of the present disclosure will become more apparent to one of ordinary skill in the art to which the present disclosure pertains by referencing the detailed description of the present disclosure given below. Other features and exemplary embodiments may be apparent from the following detailed description, the drawings, and the claims.

BRIEF DESCRIPTION OF THE DRAWINGS

The above and other aspects and features of the present disclosure will become more apparent by describing in detail example embodiments thereof and with reference to the attached drawings.

DETAILED DESCRIPTION

Figure 1:
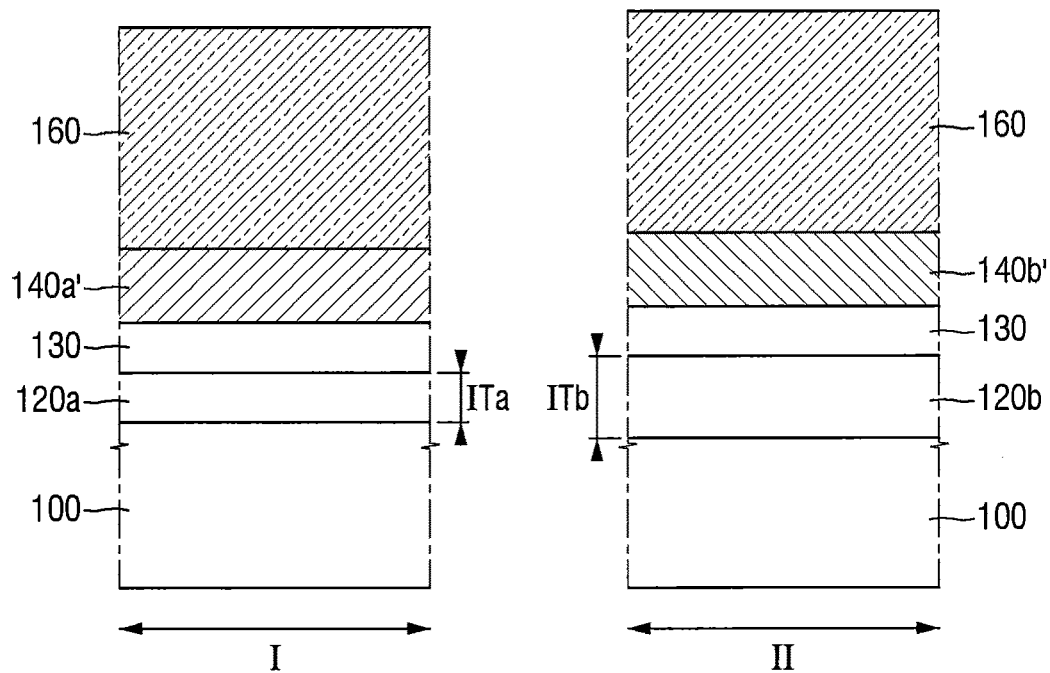
FIG. 1 is a schematic view of a semiconductor device according to an example embodiment of the present disclosure.

FIG. 1 is a schematic view of a semiconductor device according to an example embodiment of the present disclosure.

Referring to FIG. 1, the semiconductor device according to the present example embodiment includes a substrate 100, first and second interface films 120a and 120b, a dielectric film 130, first and second metal films 140a' and 140b', and a gap-fill metal 160.

The substrate 100 may be, for example, a bulk silicon substrate or a silicon-on-insulator (SOI) substrate. Alternatively, the substrate 100 may be a silicon substrate or may comprise other materials such as silicon germanium, indium antimonide, a lead tellurium compound, indium arsenide, indium phosphide, gallium arsenide, or gallium antimonide. Alternatively, the substrate 100 may have an epitaxial layer formed on a base substrate. In the description that follows, it is assumed that the substrate 100 is, for example, a silicon substrate.

The substrate 100 may include first and second regions I and II. Specifically, the first interface film 120a, the dielectric film 130, the first metal film 140a', and the gap-fill metal 160 may be disposed on the substrate 100 in the first region I. The second interface film 120b, the dielectric film 130, the second metal film 140b', and the gap-fill metal 160 may be disposed on the substrate 100 in the second region II.

The first and second regions I and II may be regions where semiconductor elements having different characteristics are arranged as necessary. The first region I may be, for example, a region where a transistor having high-performance charge transfer characteristics is disposed. The second region II may be, for example, a region where a transistor having small leakage current characteristics is disposed.

The first and second interface films 120a and 120b may be disposed on the substrate 100. Specifically, the first interface film 120a may be disposed in the first region I to be interposed between the substrate 100 and the dielectric film 130, and the second interface film 120b may be disposed in the second region II to be interposed between the substrate 100 and the dielectric film 130.

The first and second interface films 120a and 120b may comprise an oxide of the substrate 100. Specifically, the first and second interface films 120a and 120b may be formed by oxidizing an upper portion of the substrate 100. For example, when the substrate 100 comprises silicon, the first and second interface films 120a and 120b may comprise silicon oxide.

Accordingly, the first and second interface films 120a and 120b can reduce/prevent interface failure between the substrate 100 and the dielectric film 130.

In some embodiments, the first and second interface films 120a and 120b may have different thicknesses. Specifically, as illustrated in FIG. 1, a thickness ITa of the first interface film 120a may be different from a thickness ITb of the second interface film 120b. For example, the thickness ITa of the first interface film 120a may be about 2 Å to 9 Å, and the thickness ITb of the second interface film 120b may be about 11 Å to 18 Å. Preferably, the thickness ITa of the first interface film 120a may be about 4 Å to 7 Å, and the thickness ITb of the second interface film 120b may be about 13 Å to 16 Å. The bottom surface of the second interface film 120b may be lower than the bottom surface of the first interface film 120a, and the top surface of the second interface film 120b may be higher than the top surface of the first interface film 120a.

Different characteristics may be required of different semiconductor elements provided in a chip. High-performance charge transfer characteristics may be more important for some semiconductor elements than for other semiconductor elements, and low leakage current characteristics may be more important for some semiconductor elements than for other semiconductor elements.

A thin interface film facilitates a gate electrode's control and can thus improve the charge transfer characteristics of a transistor. That is, the first interface film 120a, which is relatively thin, may be suitable for a transistor that requires high-performance charge transfer characteristics.

As described above, in some embodiments, the thickness ITa of the first interface film 120a may be about 2 Å to 9 Å. If the thickness ITa of the first interface film 120a is less than about 2 Å, an excessive leakage current may be generated due to, for example, defects that may occur in the process of forming the semiconductor device. On the other hand, if the thickness ITa of the first interface film 120a is greater than about 9 Å, charge transfer characteristics may deteriorate and may not be suitable for a transistor that requires high-performance charge transfer characteristics.

On the contrary, a thick interface film can minimize a leakage current by minimizing defects. That is, the second interface film 120b, which is relatively thick, may be suitable for a transistor that requires small leakage current characteristic.

As described above, in some embodiments, the thickness ITb of the second interface film 120b may be about 11 Å to 18 Å. If the thickness ITb of the second interface film 120b is less than about 11 Å, leakage current characteristics may deteriorate and may not be suitable for a transistor that requires small leakage current characteristics. On the other hand, if the thickness ITb of the second interface film 120b is greater than about 18 Å, charge transfer characteristics may deteriorate more than necessary.

In some embodiments, the thickness ITb of the second interface film 120b may be greater than the thickness ITa of the first interface film 120a. For example, the thickness ITb of the second interface film 120b may be about 9 Å to 11 Å greater than the thickness ITa of the first interface film 120a. For example, if the thickness ITa of the first interface film 120a is about 2 Å to 9 Å, the thickness ITb of the second interface film 120b may be about 9 Å to 11 Å greater than the thickness ITa of the first interface film 120a. For example, if the thickness ITa of the second interface film 120b is about 11 Å to 18 Å, the thickness ITa of the first interface film 120a may be about 9 Å to 11 Å less than the thickness ITb of the second interface film 120b.

That is, the first interface film 120a may provide better charge transfer characteristics than the second interface film 120b, and the second interface film 120b may provide better leakage current characteristics than the first interface film 120a. However, if the difference between the thickness ITb of the second interface film 120b and the thickness ITa of the first interface film 120a is less than about 9 Å, the second interface film 120b may not be able to sufficiently reduce a leakage current. On the other hand, if the difference between the thickness ITb of the second interface film 120b and the thickness ITa of the first interface film 120a is greater than about 11 Å, the process margin for subsequent processing may be reduced due to the height difference between the first interface film 120a and the second interface film 120a.

The dielectric film 130 may be disposed on the first and second interface films 120a and 120b. Specifically, the dielectric film 130 may be disposed in the first region I to be interposed between the first interface film 120a and the first metal film 140a', and may be disposed in the second region II to be interposed between the second interface film 120a and the second metal film 140b'.

The dielectric film 130 is illustrated in FIG. 1 as being a single layer, but the present disclosure is not limited thereto. That is, alternatively, the dielectric film 130 may be formed as a multilayer film.

The dielectric film 130 may comprise a high-k dielectric material having a higher dielectric constant than the first and second interface layers 120a and 120b. The dielectric film 130 may be formed of, for example, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or a combination thereof, but the present disclosure is not limited thereto.

The first and second metal films 140a' and 140b' may be disposed on the dielectric film 130. Specifically, the first metal film 140a' may be disposed in the first region I to be interposed between the dielectric film 130 and the gap-fill metal 160, and the second metal film 140b' may be disposed in the second region II to be interposed between the dielectric film 130 and the gap-fill metal 160.

The first and second metal films 140a' and 140b' are illustrated in FIG. 1 as being single layers, but the present disclosure is not limited thereto. That is, alternatively, the first and second metal films 140a' and 140b' may be formed as multilayer films.

The first and second metal films 140a' and 140b' may be films that control a work function in the semiconductor device. The first and second metal films 140a' and 140b' comprise at least one of TiN, TaN, W, TiAlC, TiAl, TaAl, Al, Ti, WN, Ru, Mo, and a combination thereof.

The first and second metal films 140a' and 140b' may have different oxygen contents in their natural oxidation state. The term "natural oxidation state", as used herein, denotes a state in which a target metal is exposed to the atmosphere and the surface of the target metal is naturally oxidized.

Specifically, the first metal film 140a' may have a first oxygen content in its natural oxidation state, and the second metal film 140b' may have a second oxygen content, which is greater than the first oxygen content, in its natural oxidation state. Each of the first and second oxygen contents may be the oxygen content of a metal film that is diffusible into the substrate 100 by a particular process.

For example, if the first metal film 140a' comprises TiN, the first oxygen content may be the oxygen content of a naturally oxidized TiN that is diffusible into the substrate 100 by annealing. Similarly, if the second metal film 140b' comprises TaN, the second oxygen content may be the oxygen content of a naturally oxidized TaN that is diffusible into the substrate 100 by annealing.

In some embodiments, the first and second metal films 140a' and 140b' may comprise different materials. For example, the first metal film 140a' may comprise TiN, and the second metal film 140b' may comprise TaN. Accordingly, the second oxygen content may be greater than the first oxygen content. This will be described later with reference to FIG. 12.

The gap-fill metal 160 may be disposed on the first and second metal films 140a' and 140b'. Specifically, the gap-fill metal 160 may be disposed on the first metal film 140a' in the first region I and may be disposed on the second metal film 140b' in the second region II.

The gap-fill metal 160 may form a gate electrode together with the first or second metal film 140a' or 140b'.

The gap-fill metal 160 may comprise, for example, W, Al, Si, or SiGe, but the present disclosure is not limited thereto.

The semiconductor device may include the first interface film 120a, which is relatively thin, in the first region I and the second interface film 120b, which is relatively thick, in the second region II. Accordingly, the performance of the semiconductor device according to the present exemplary embodiment can be improved.

That is, in the semiconductor device, a thin interface film is formed in a region where high-performance charge transfer characteristics are needed, and a thick interface film is formed in a region where low leakage current characteristics are needed. Accordingly, the performance of the semiconductor device may be improved by forming interface films having different thicknesses in different regions, as necessary.

A method of fabricating a semiconductor device according to an example embodiment of the present disclosure will hereinafter be described with reference to FIGS. 2 through 6. For convenience, descriptions of elements that have already been described above with reference to FIG. 1 will be omitted, or at least simplified.

FIGS. 2 through 6 are schematic views illustrating steps of a method of fabricating a semiconductor device according to an example embodiment of the present disclosure.

Figure 2:
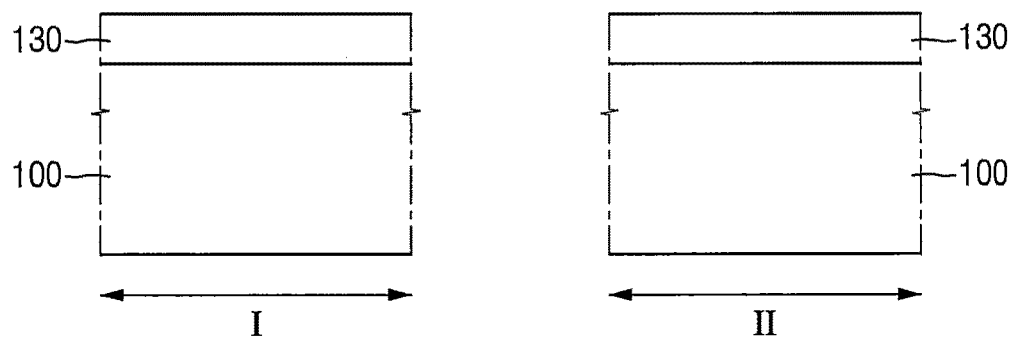
FIGS. 2 through 6 are schematic views illustrating operations of a method of fabricating a semiconductor device.

Referring to FIG. 2, a dielectric film 130 is formed on a substrate 100.

The dielectric film 130 may be formed to have a thickness of, for example, about 10 Å to 20 Å, but the present disclosure is not limited thereto.

The dielectric film 130 may be formed by a process such as atomic layer deposition (ALD), chemical vapor deposition (CVD), or physical vapor deposition (PVD).

The dielectric film 130 is illustrated in FIG. 2 as being formed directly on the substrate 100, but the present disclosure is not limited thereto. That is, alternatively, the dielectric film 130 may be formed on an oxidized substrate (or a preliminary interface film).

For example, preliminary interface films may be formed by oxidizing the upper portion of the substrate 100 before the formation of the dielectric film 130. The preliminary interface films may reduce/prevent interface failure between the substrate 100 and the dielectric film 130 during the formation of the dielectric film 130.

Figure 3:
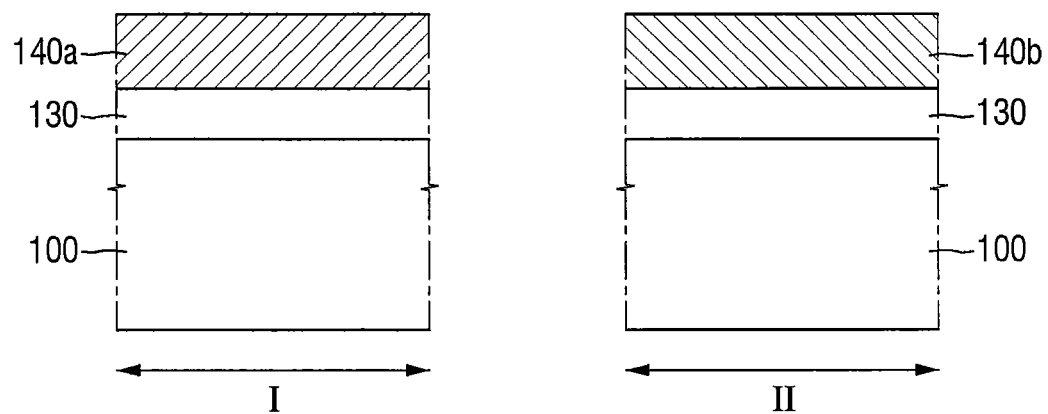

Referring to FIG. 3, first and second preliminary metal films 140a and 140b are formed on the dielectric film 130. Specifically, the first preliminary metal film 140a is formed on the dielectric film 130 in a first region I, and the second preliminary film 140b is formed on the dielectric film 130 in a second region II.

The first and second preliminary metal films 140a and 140b may comprise at least one of TiN, TaN, W, TiAlC, TiAl, TaAl, Al, Ti, WN, Ru, Mo, and a combination thereof.

The first and second preliminary metal films 140a and 140b may be formed by, for example, ALD, metal organic ALD (MOALD), or metal organic chemical vapor deposition (MOCVD).

The first and second preliminary metal films 140a and 140b, which are formed on the dielectric film 130, may be exposed to the atmosphere and may be naturally oxidized. As a result, the first and second preliminary metal films 140a and 140b may be able to contain a certain amount of oxygen without being subject to any artificial oxidation process.

For example, the first preliminary metal film 140a may have a first oxygen content, and the second preliminary metal film 140b may have a second oxygen content. The second oxygen content may be greater than the first oxygen content. As already described above with reference to FIG. 1, each of the first and second oxygen contents may be the oxygen content of a metal film that is diffusible into the substrate 100 by a particular process.

That is, the first preliminary metal film 140a may correspond to the first metal film 140a' of FIG. 1 in its natural oxidation state. Similarly, the second preliminary metal film 140b may correspond to the second metal film 140b' of FIG. 1 in its natural oxidation state.

In some embodiments, the first and second preliminary metal films 140a and 140b may comprise different materials. For example, the first preliminary metal film 140a may comprise TiN, and the second preliminary metal film 140b may comprise TaN. Accordingly, the second oxygen content may be greater than the first oxygen content. This will be described later with reference to FIG. 12.

Figure 4:
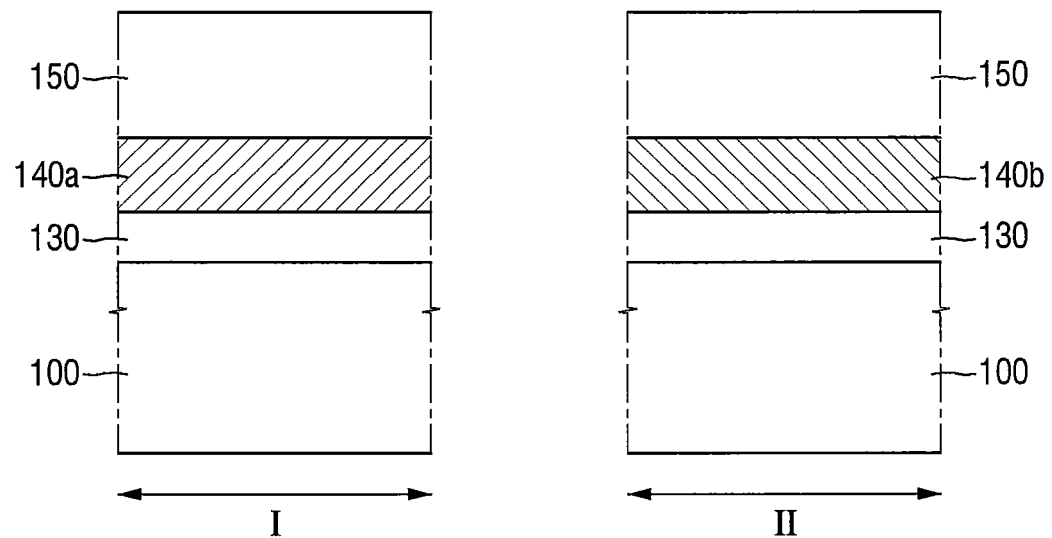

Referring to FIG. 4, a capping film 150 is formed on the first and second preliminary metal films 140a and 140b.

Specifically, the capping film 150 is formed on the first preliminary metal film 140a in the first region I and is formed on the second preliminary metal film 140b in the second region II.

The capping film 150 may comprise, for example, silicon (Si), silicon oxide ($SiO_2$), aluminum oxide ($Al_2O_3$), aluminum nitride (AlN), or a combination thereof, but the present disclosure is not limited thereto.

Figure 5:
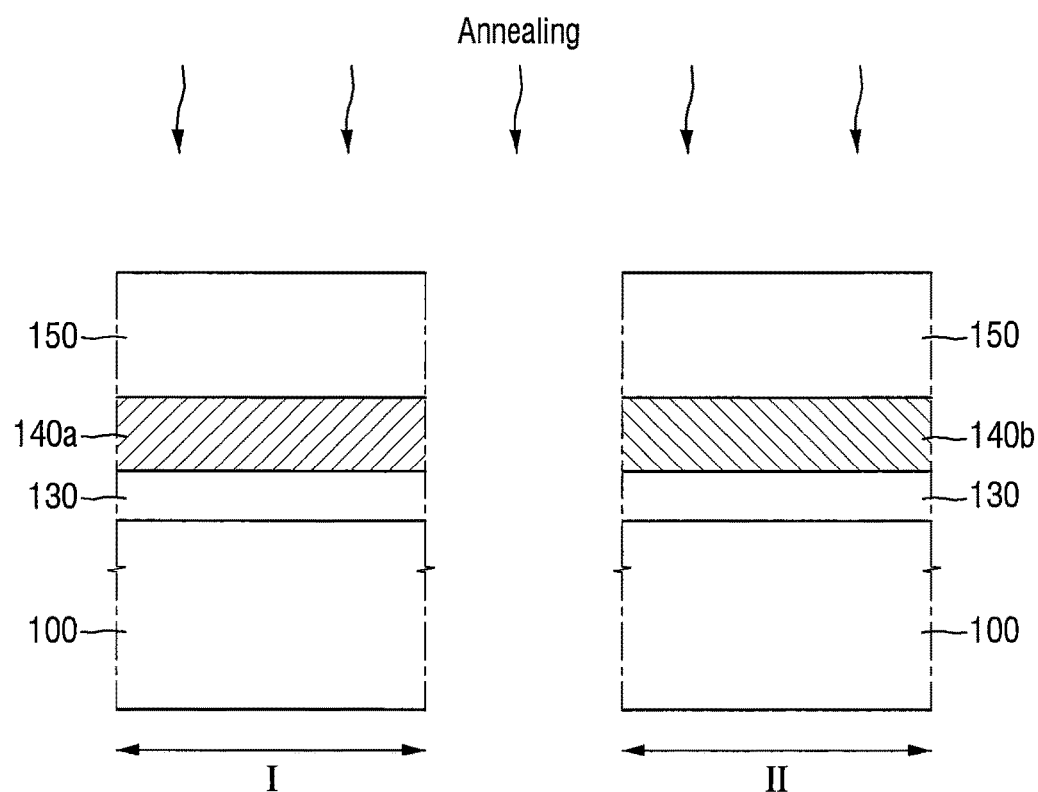
Figure 6:
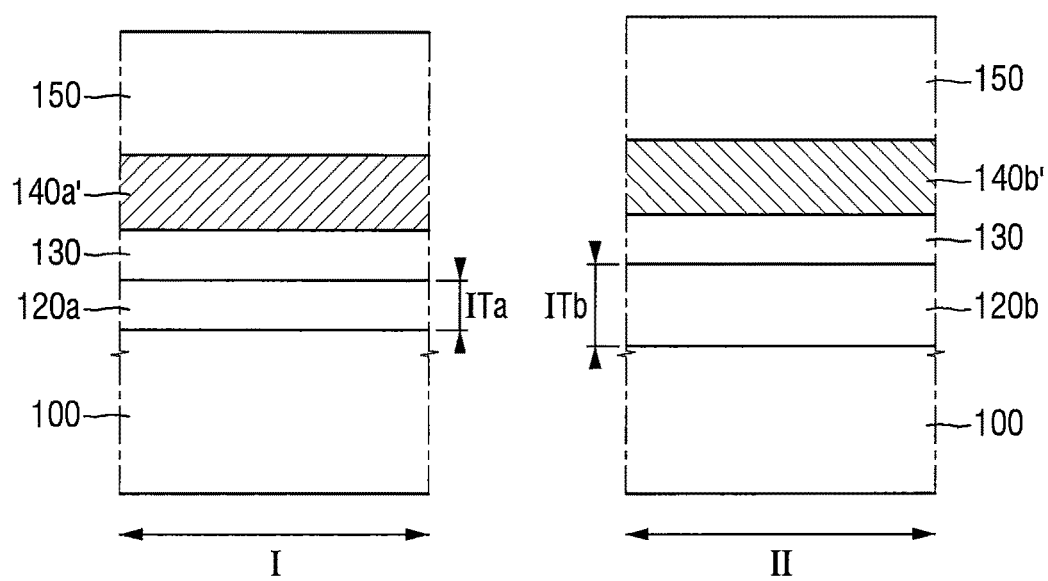

Referring to FIGS. 5 and 6, first and second interface films 120a and 120b are formed by performing annealing on the structure illustrated in FIG. 4.

Specifically, by performing annealing, the first interface film 120a is formed on the substrate 100 in the first region I, and the second interface film 120b is formed on the substrate 100 in the second region II.

As described above, the oxygen contained in each of the naturally oxidized first and second preliminary metal films 140a and 140b may be diffused into the substrate 100 by an annealing process. Specifically, as much oxygen contained in the first preliminary metal film 140a as the first oxygen content may be diffused into the substrate 100, and as much oxygen contained in the second preliminary metal film 140b as the second oxygen content may be diffused into the substrate 100. The oxygen diffused into the substrate 100 may form the first and second interface films 120a and 120b.

The first preliminary metal film 140a forms the first metal film 140a' by being deprived of oxygen. Similarly, the second preliminary metal film 140b forms the second metal film 140b' by being deprived of oxygen.

In some embodiments, since the second oxygen content is greater than the first oxygen content, a thickness ITb of the second interface film 120b is greater than a thickness ITa of the first interface film 120a.

Since the first and second interface films 120a and 120b are formed by oxidizing the substrate 100, the bottom surface of the second interface film 120b may be lower than the bottom surface of the first interface film 120a, and the top surface of the second interface film 120b may be higher than the top surface of the first interface film 120a.

The annealing process may be performed at a predetermined temperature. For example, annealing may be performed at a temperature of about 100° C. to 2000° C.

The annealing process may be performed for a predetermined amount of time. For example, annealing may be performed for about 0.1 seconds to 1 hour.

The annealing process may be performed under an oxidizing condition, but the present disclosure is not limited thereto. That is, alternatively, the annealing process may be performed under a reducing condition or under a vacuum condition.

In some embodiments, preliminary interface films may be formed on the substrate 100 before the formation of the dielectric film 130. For example, the preliminary interface films may be formed by oxidizing the upper portion of the substrate 100 before the formation of the dielectric film 130. Accordingly, the formation of the first and second interface films 120a and 120b may involve transforming the preliminary interface films into the first and second interface films 120a and 120b by performing annealing.

Thereafter, the capping film 150 is removed, and the semiconductor device of FIG. 1 may be formed by forming gate electrodes on the first and second metal films 140a' and 140b'.

Accordingly, the method of fabricating a semiconductor device discussed above may improve the performance of a semiconductor device by forming interface films having different thicknesses in different regions, as necessary.

A semiconductor device according to an example embodiment of the present disclosure will hereinafter be described with reference to FIG. 7. For convenience, descriptions of elements that have already been described above with reference to FIGS. 1 through 6 will be omitted, or at least simplified.

Figure 7:
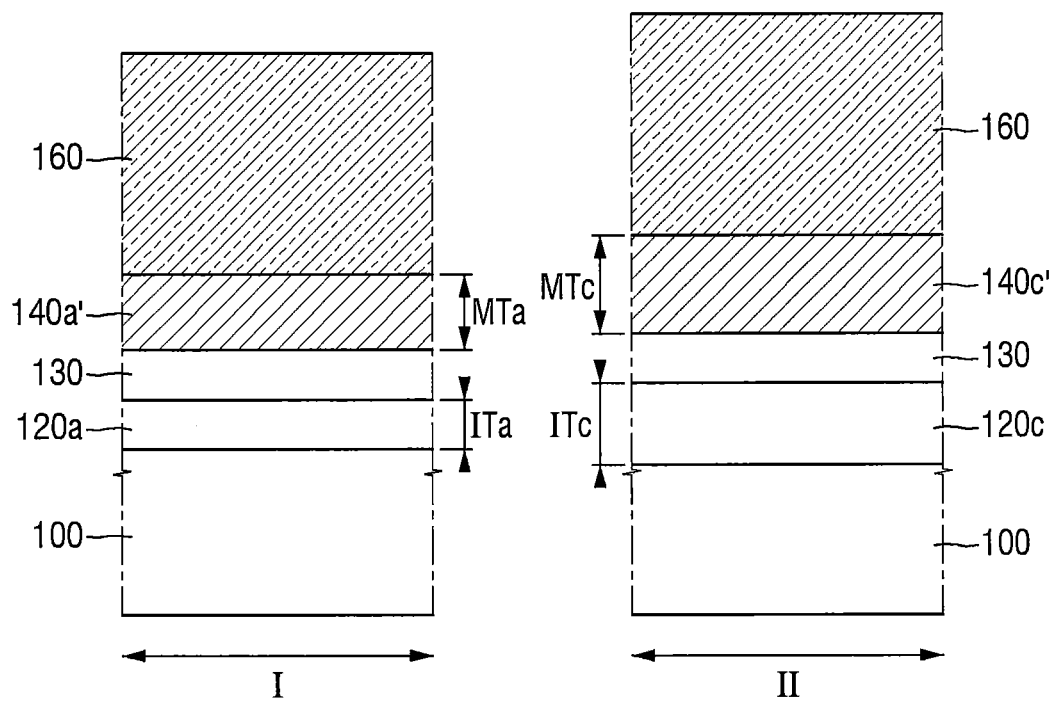
FIG. 7 is a schematic view of a semiconductor device according to an example embodiment of the present disclosure.

FIG. 7 is a schematic view of a semiconductor device according to an example embodiment of the present disclosure.

Referring to FIG. 7, the semiconductor device according to the present example embodiment includes first and third interface films 120a and 120c and first and third metal films 140a' and 140c'.

The third interface film 120c may be disposed on a substrate 100. Specifically, the third interface film 120c, instead of the second interface film 120b of FIG. 1, may be disposed in a second region II to be interposed between the substrate 100 and a dielectric film 130.

In some exemplary embodiments, the first and third interface films 120a and 120c may have different thicknesses. Specifically, as illustrated in FIG. 7, a thickness ITa of the first interface film 120a may be different from a thickness ITc of the third interface film 120c. For example, the thickness ITa of the first interface film 120a may be about 2 Å to 9 Å, and the thickness ITc of the third interface film 120c may be about 11 Å to 18 Å. Preferably, the thickness ITa of the first interface film 120a may be about 4 Å to 7 Å, and the thickness ITc of the third interface film 120c may be about 13 Å to 16 Å. The bottom surface of the third interface film 120c may be lower than the bottom surface of the first interface film 120a, and the top surface of the third interface film 120c may be higher than the top surface of the first interface film 120a.

In some embodiments, the thickness ITc of the third interface film 120c may be greater than the thickness ITa of the first interface film 120a. For example, the thickness ITc of the third interface film 120c may be about 9 Å to 11 Å greater than the thickness ITa of the first interface film 120a. For example, if the thickness ITa of the first interface film 120a is about 2 Å to 9 Å, the thickness ITc of the third interface film 120c may be about 9 Å to 11 Å greater than the thickness ITa of the first interface film 120a. For example, if the thickness ITc of the third interface film 120c is about 11 Å to 18 Å, the thickness ITa of the first interface film 120a may be about 9 Å to 11 Å less than the thickness ITc of the second interface film 120c.

The third metal film 140c' may be disposed on the dielectric film 130. Specifically, the third metal film 140c', instead of the second metal film 140b' of FIG. 1, may be disposed in the second region II to be interposed between the dielectric film 130 and a gap-fill metal 160.

In some embodiments, the first and third metal films 140a' and 140c' may have different thicknesses. Specifically, as illustrated in FIG. 7, a thickness MTc of the third metal film 140c' may be different from a thickness MTa of the first metal film 140a'. For example, the thickness MTa of the first metal film 140a' may be about 7 Å to 18 Å, and the thickness MTc of the third metal film 140c' may be about 22 Å to 33 Å. Preferably, the thickness MTa of the first metal film 140a' may be about 10 Å to 15 Å, and the thickness MTc of the third metal film 140c' may be about 25 Å to 30 Å.

In some embodiments, the thickness MTc of the third metal film 140c' may be greater than the thickness MTa of the first metal film 140a'. For example, the thickness MTc of the third metal film 140c' may be about 14 Å to 16 Å greater than the thickness MTa of the first metal film 140a'. For example, if the thickness MTa of the first metal film 140a' is about 7 Å to 18 Å, the thickness MTc of the third metal film 140c' may be about 14 Å to 16 Å greater than the thickness MTa of the first metal film 140a'. For example, if the thickness MTc of the third metal film 140c' is about 22 Å to 33 Å, the thickness MTa of the first metal film 140a' may be about 14 Å to 16 Å less than the thickness MTc of the third metal film 140c'.

As a result, the first and third metal films 140a' and 140c' may have different oxygen contents in their natural oxidation state. Specifically, the first metal film 140a' may have a first oxygen content in its natural oxidation state, and the third metal film 140c' may have a third oxygen content, which is greater than the first oxygen content, in its natural oxidation state.

Accordingly, the performance of the semiconductor device according to the present exemplary embodiment can be improved by forming interface films having different thicknesses in different regions, as necessary.

A method of fabricating a semiconductor device according to an example embodiment of the present disclosure will hereinafter be described with reference to FIGS. 8 through 11. For convenience, descriptions of elements that have already been described above with reference to FIGS. 1 through 7 will be omitted, or at least simplified.

FIGS. 8 through 11 are schematic views illustrating steps of a method of fabricating a semiconductor device according to an example embodiment of the present disclosure.

Figure 8:
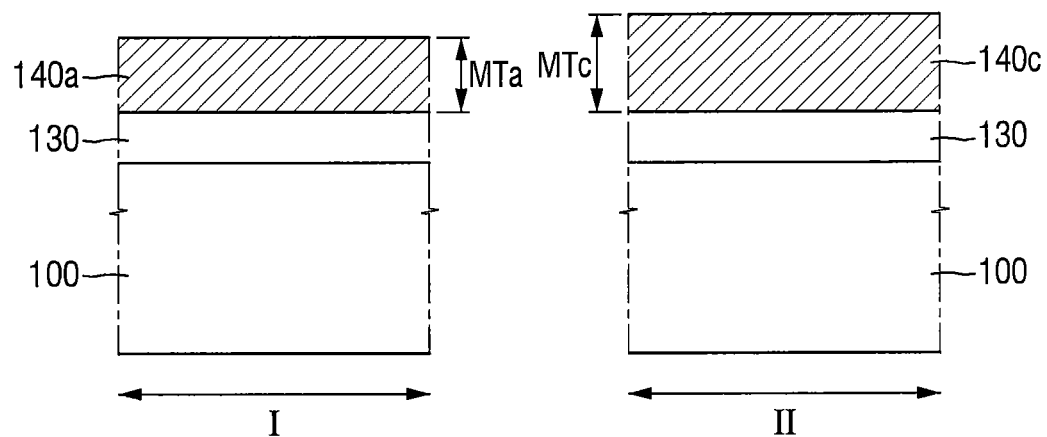
FIGS. 8 through 11 are schematic views illustrating operation of a method of fabricating a semiconductor device.

Referring to FIG. 8, first and third preliminary metal films 140a and 140c are formed on the structure illustrated in FIG. 2.

Specifically, the first preliminary metal film 140a is formed on the dielectric film 130 in a first region I, and the third preliminary film 140c is formed on the dielectric film 130 in a second region II.

The first and third preliminary metal films 140a and 140c, which are formed on the dielectric film 130, may be exposed to the atmosphere and may be naturally oxidized. As a result, the first and third preliminary metal films 140a and 140c may be able to contain a certain amount of oxygen without being subject to any artificial oxidation process.

For example, the first preliminary metal film 140a may have a first oxygen content, and the third preliminary metal film 140c may have a third oxygen content. The third oxygen content may be greater than the first oxygen content.

That is, the first preliminary metal film 140a may correspond to the first metal film 140a' of FIG. 7 in its natural oxidation state. Similarly, the third preliminary metal film 140c may correspond to the third metal film 140c' of FIG. 7 in its natural oxidation state.

In some embodiments, the first and third metal films 140a' and 140c' may have different thicknesses. For example, a thickness MTc of the third metal film 140c' may be greater than a thickness MTa of the first metal film 140a'.

If the first and third preliminary metal films 140a and 140c are formed to less than a predetermined thickness, the first and third preliminary metal films 140a and 140c may have first and third oxygen contents, which are different from each other. For example, if the first and third preliminary metal films 140a and 140c are formed to have a thickness of 30 Å or less, the third preliminary metal film 140c, which has a thickness greater than the thickness MTa of the first preliminary metal film 140a, may contain a larger amount of oxygen than the first preliminary metal film 140a. Accordingly, the third oxygen content may be greater than the first oxygen content. This will be described later with reference to FIG. 12.

In some embodiments, the first and third preliminary metal films 140a and 140c may have a thickness of about 2 Å to 30 Å.

If the thickness of the first and third preliminary metal films 140a and 140c is less than 2 Å, the first and third preliminary metal films 140a and 140c in their natural oxidation state may not be able to contain a sufficient amount of oxygen to oxidize the substrate 100 to form interface films. As a result, the first and third preliminary metal films 140a and 140c may not be able to form first and third interface films 120a and 120c.

On the other hand, if the thickness of the first and third preliminary metal films 140a and 140c is greater than 30 Å, the first and third preliminary metal films 140a and 140c in their natural oxidation state may contain substantially the same amount of oxygen. As a result, the first and third preliminary metal films 140a and 140c may not be able to form a difference in thickness between the first and third interface films 120a and 120c.

Figure 9:
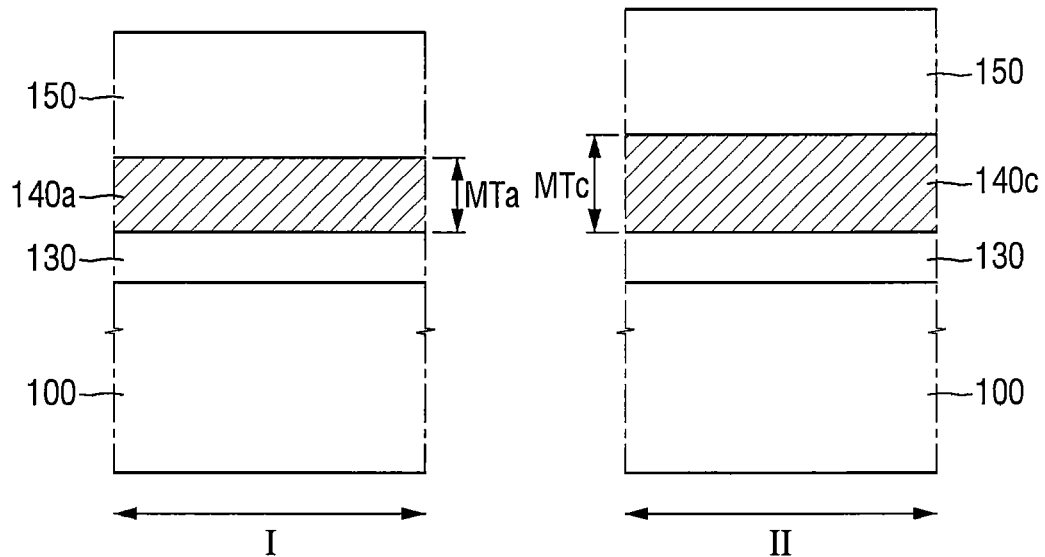

Referring to FIG. 9, a capping film 150 is formed on the first and third preliminary metal films 140a and 140c.

Specifically, the capping film 150 is formed on the first preliminary metal film 140a in the first region I and is formed on the third preliminary metal film 140c in the second region II.

Figure 10:
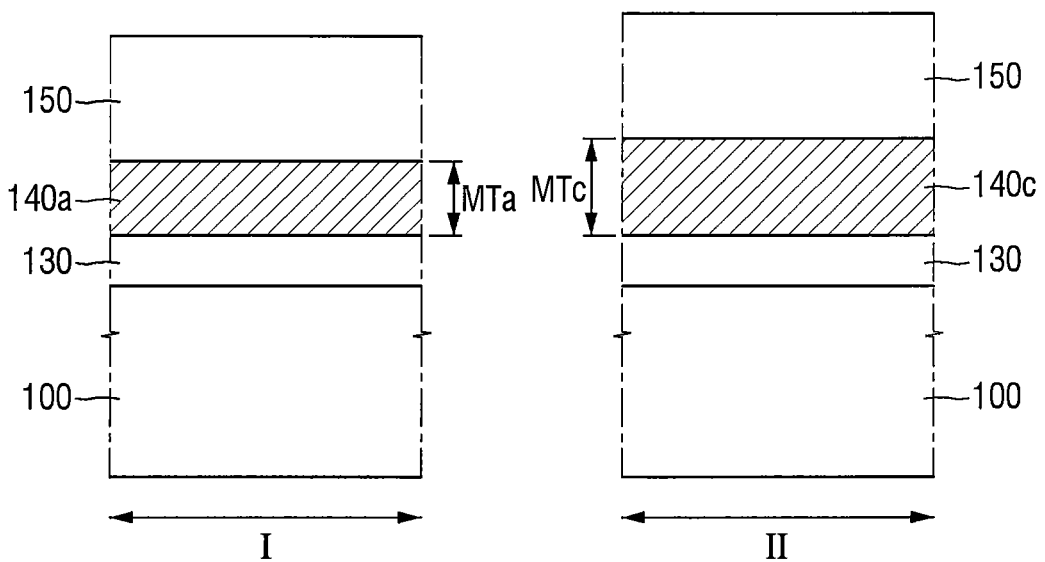
Figure 11:
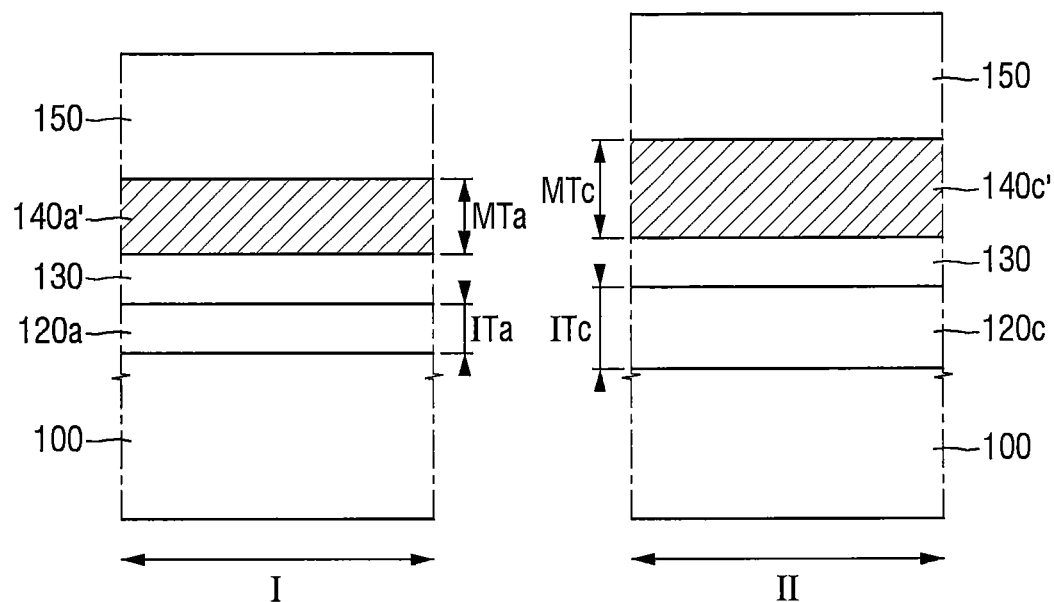

Referring to FIGS. 10 and 11, the first and third interface films 120a and 120c are formed by performing annealing on the structure illustrated in FIG. 9.

Specifically, by performing annealing, the first interface film 120a is formed on the substrate 100 in the first region I, and the third interface film 120c is formed on the substrate 100 in the second region II.

As described above, the oxygen contained in each of the naturally oxidized first and third preliminary metal films 140a and 140c is diffusible into the substrate 100 by annealing. Specifically, as much oxygen contained in the first preliminary metal film 140a as the first oxygen content can be diffused into the substrate 100, and as much oxygen contained in the third preliminary metal film 140c as the third oxygen content can be diffused into the substrate 100. The oxygen diffused into the substrate 100 may form the first and third interface films 120a and 120c.

The first preliminary metal film 140a forms the first metal film 140a' by being deprived of oxygen. Similarly, the third preliminary metal film 140c forms the third metal film 140c' by being deprived of oxygen.

In some embodiments, since the third oxygen content is greater than the first oxygen content, a thickness ITc of the third interface film 120c is greater than a thickness ITa of the first interface film 120a. In some embodiments, a thickness MTa of the first metal film 140a' may be about 7 Å to 18 Å, and a thickness MTc of the third metal film 140c' may be about 22 Å to 33 Å. In some embodiments, the thickness ITa of the first interface film 120a may be about 2 Å to 9 Å, and the thickness ITc of the third interface film 120c may be about 11 Å to 18 Å.

Since the first and third interface films 120a and 120c are formed by oxidizing the substrate 100, the bottom surface of the third interface film 120c may be lower than the bottom surface of the first interface film 120a, and the top surface of the third interface film 120c may be higher than the top surface of the first interface film 120a.

Thereafter, the capping film 150 is removed, and the semiconductor device of FIG. 7 may be formed by forming gate electrodes on the first and third metal films 140a' and 140c'.

Accordingly, the method of fabricating a semiconductor device discussed above can improve the performance of a semiconductor device by forming interface films having different thicknesses in different regions, as necessary.

Figure 12:
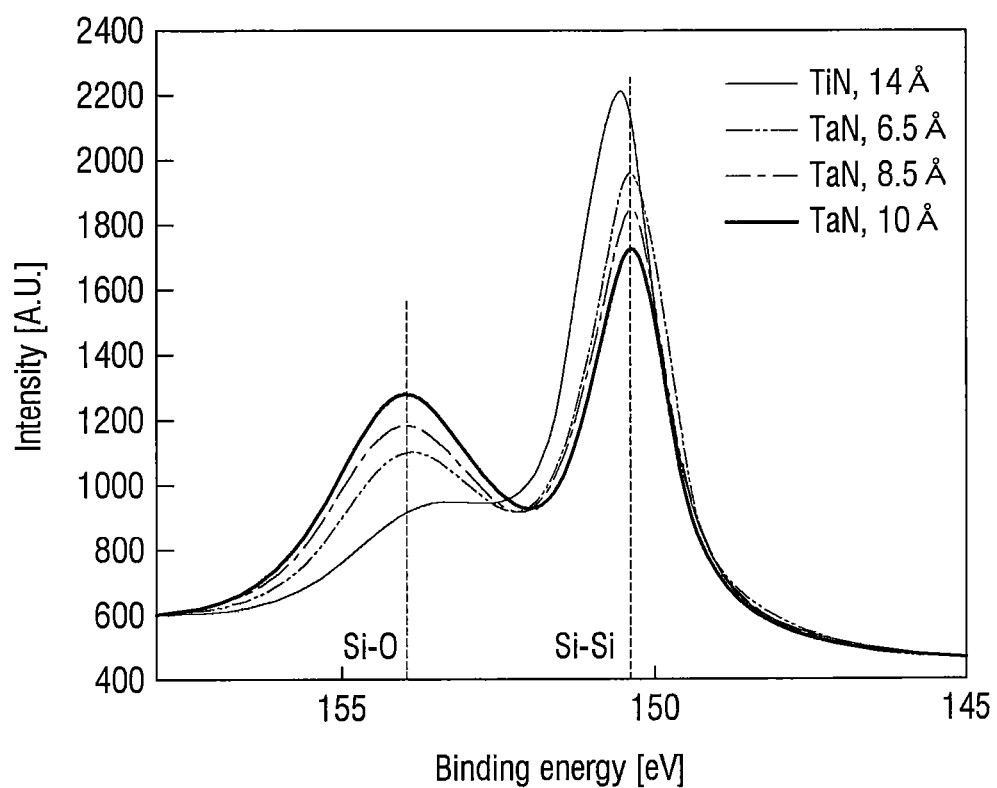
FIG. 12 is a graph showing the relationship between the type and thickness of a preliminary metal film and the thickness of an interface film.

FIG. 12 is a graph showing the relationship between the type and thickness of a preliminary metal film and the thickness of an interface film.

Specifically, FIG. 12 is a graph showing binding energy measurements obtained from a semiconductor device having preliminary metal films, using X-ray photoelectron spectroscopy (XPS). A binding energy of about 154 eV corresponds to the energy of Si—O bonds, and a binding energy of about 150 eV corresponds to the energy of Si—Si bonds.

Referring to FIG. 12, as the thickness of a preliminary metal film increases, the number of Si—O bonds of a semiconductor device increases. For example, as the thickness of a preliminary metal film comprising TaN increases from 6.5 Å to 8.5 Å to 10 Å, the number of Si—O bonds of a semiconductor device increases. That is, the thickness of an interface film can be increased by increasing the thickness of a preliminary metal film.

The number of Si—O bonds of a semiconductor device may vary according to the material of a preliminary metal film of the semiconductor device. For example, a semiconductor device having a TaN preliminary metal film may have more Si—O bonds than a semiconductor device having a TiN preliminary metal film. That is, by using different types of preliminary metal films, interface films of different thicknesses can be obtained.

A semiconductor device according to an example embodiment of the present disclosure will hereinafter be described with reference to FIGS. 13A through 13C. For convenience, descriptions of elements that have already been described above with reference to FIGS. 1 through 12 will be omitted, or at least simplified.

Figure 13A:
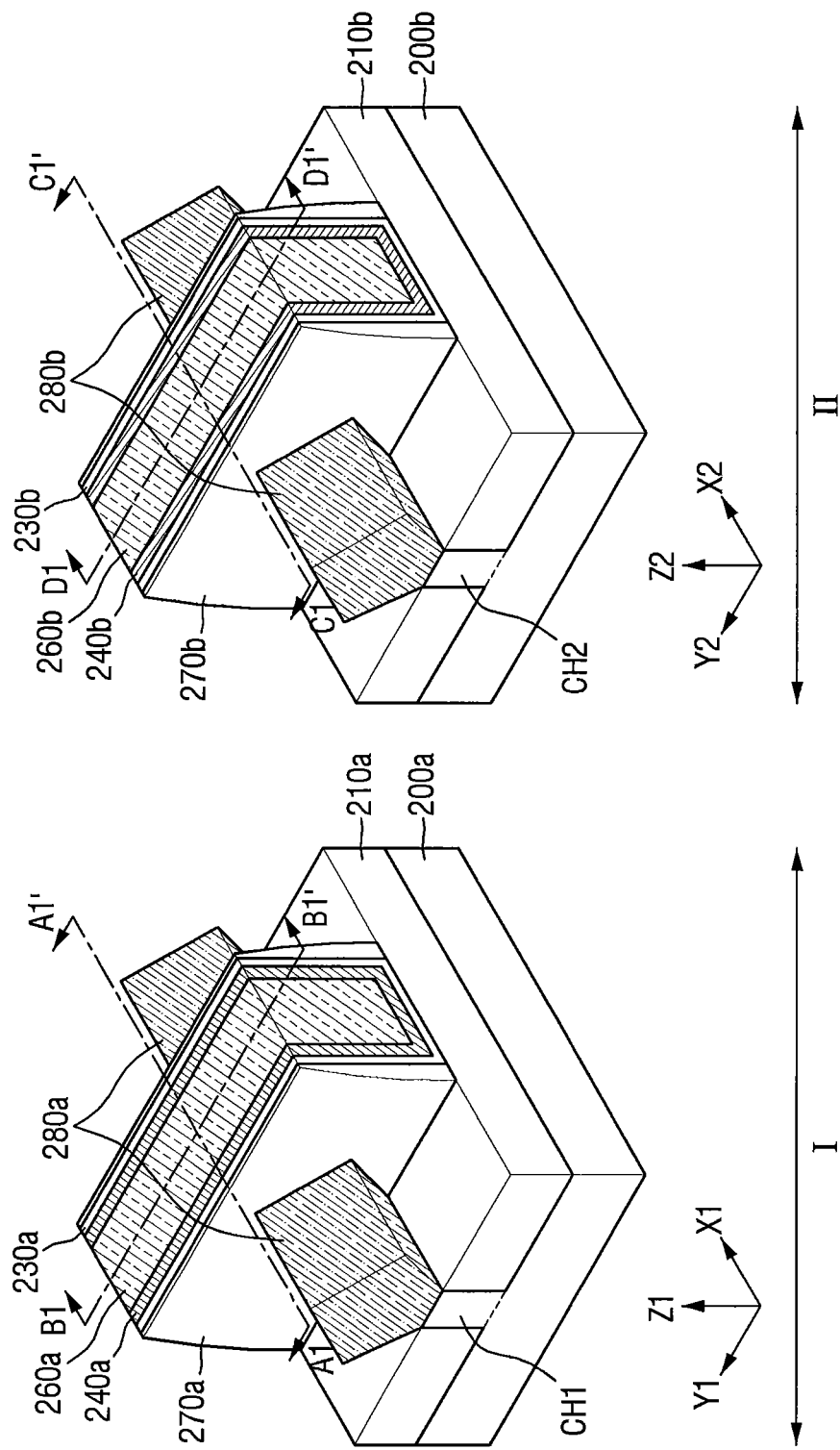
FIG. 13A is a perspective view of a semiconductor device according to an example embodiment of the present disclosure.

FIG. 13A is a perspective view of a semiconductor device according to an example embodiment of the present disclosure. FIG. 13B is a cross-sectional view taken along lines A1-A1' and C1-C1' of FIG. 13A. FIG. 13C is a cross-sectional view taken along lines B1-B1' and D1-D1' of FIG. 13A.

Figure 13B:
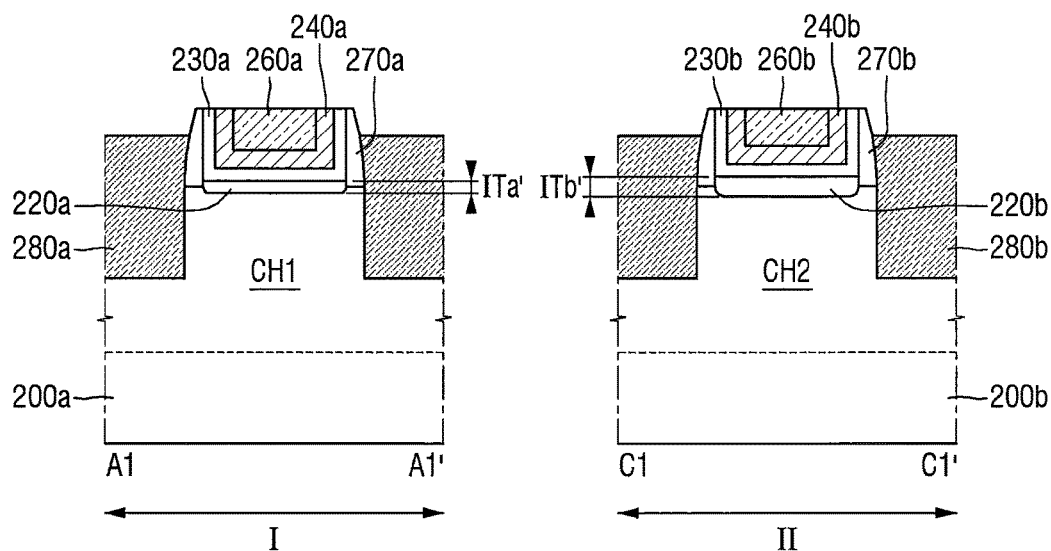
FIG. 13B is a cross-sectional view taken along lines A1-A1' and C1-C1' of FIG. 13A.
Figure 13C:
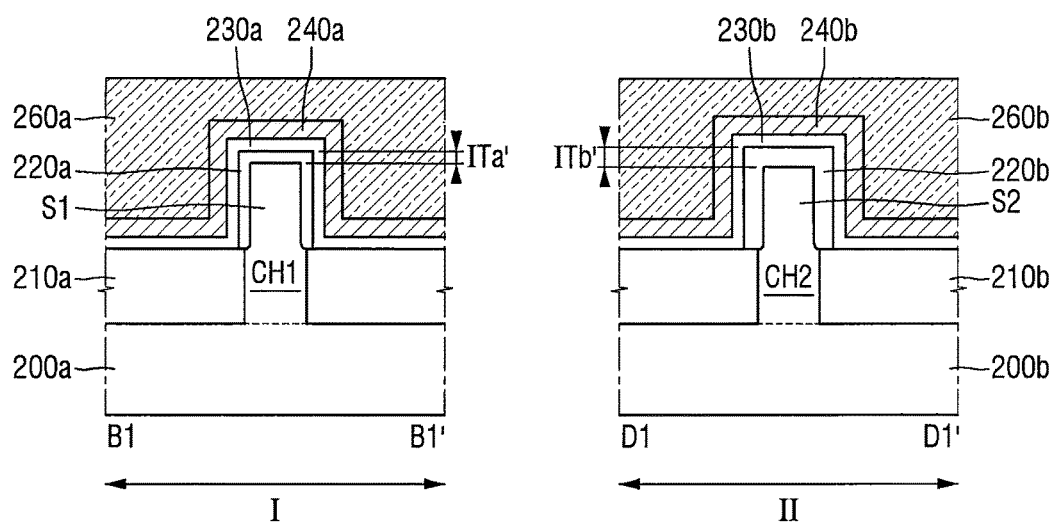
FIG. 13C is a cross-sectional view taken along lines B1-B1' and D1-D1' of FIG. 13A.

FIGS. 13A through 13C illustrate entire structures formed on first and second isolation films 210a and 210b except for an interlayer insulating film, but actually, an interlayer insulating film comprising an insulating material may be formed on the first and second isolation films 210a and 210b.

Referring to FIGS. 13A through 13C, the semiconductor device may include first and second substrates 200a and 200b, the first and second isolation films 210a and 220b, first and second interface films 220a and 220b, first and second dielectric films 230a and 230b, first and second metal films 240a and 240b, first and second gap-fill metals 260a and 260b, first spacers 270a, second spacers 270b, first source/drain regions 280a, and second source/drain regions 280b.

The first and second substrates 200a and 200b may include first and second channels CH1 and CH2, respectively. For example, the first and second channels CH1 and CH2 may be in the shape of fins, nanowires, or nanosheets. In the description that follows, it is assumed that the first and second channels CH1 and CH2 may be fin-shaped.

The first channel CH1 may extend in a first direction X1 in a first region I. Similarly, the second channel CH2 may extend in a second direction X2 in a second region II.

The first isolation film 210a may be disposed on the first substrate 200a and may expose the first channel CH1. Similarly, the second isolation film 210b may be disposed on the second substrate 200b and may expose the second channel CH2.

The first and second isolation films 210a and 210b may comprise an insulating material.

The first dielectric film 230a, the first metal film 240a, the first gap-fill metal 260a, and the first spacers 270a may extend in a third direction Y1, which intersects the first direction X1, to surround the top surface and the sides of the first channel CH1. Similarly, the second dielectric film 230b, the second metal film 240b, the second gap-fill metal 260b, and the second spacers 270b may extend in a fourth direction Y2, which intersects the second direction X2, to surround the top surface and the sides of the second channel CH2.

The first spacers 270a may be formed on the sides of the first dielectric film 230a. Accordingly, the first metal film 240a, the first dielectric film 240a, and the first spacers 270a may be sequentially formed on the sides of the first gap-fill metal 260a. Similarly, the second spacers 270b may be formed on the sides of the second dielectric film 230b. Accordingly, the second metal film 240b, the second dielectric film 240b, and the second spacers 270b may be sequentially formed on the sides of the second gap-fill metal 260b.

The first source/drain regions 280a may be disposed on both sides of the first channel CH1 in the first direction X1. Similarly, the second source/drain regions 280b may be disposed on both sides of the second channel CH2 in the second direction X2.

The first source/drain regions 280a may be insulated from the first metal film 240a by the first dielectric film 230a and/or the first spacers 270a, and the second source/drain regions 280b may be insulated from the second metal film 240b by the second dielectric film 230b and/or the second spacers 270b.

The first source/drain regions 280a and the second source/drain regions 280b are illustrated in FIG. 13A as being pentagonal, but the present disclosure is not limited thereto. For example, the first source/drain regions 280a and the second source/drain regions 280b may be diamond-shaped or may be circular, rectangular, or hexagonal.

The first and second interface films 220a and 220b may be disposed on the first and second substrates 200a and 200b, respectively. Specifically, the first interface film 220a may be interposed between the first substrate 200a and the first dielectric film 230a, and the second interface film 220b may be interposed between the second substrate 200b and the second dielectric film 230b.

Accordingly, the first interface film 220a, the first dielectric film 230a, the first metal film 240a, and the first gap-fill metal 260a may be sequentially disposed on the first channel CH1. Similarly, the second interface film 220b, the second dielectric film 230b, the second metal film 240b, and the second gap-fill metal 260b may be sequentially disposed on the second channel CH2.

The first and second metal films 240a and 240b may have different oxygen contents in their natural oxidation state. Specifically, the first metal film 240a may have a first oxygen content in its natural oxidation state, and the second metal film 240b may have a second oxygen content, which is greater than the first oxygen content, in its natural oxidation state.

In some embodiments, the first and second metal films 240a and 240b may comprise different materials. For example, the first metal film 240a may comprise TiN, and the second metal film 240b may comprise TaN. Accordingly, the second oxygen content may be greater than the first oxygen content.

As described above with reference to FIG. 1, the first and second interface films 220a and 220b may have different thicknesses. For example, a thickness ITb' of the second interface film 220b may be greater than a thickness ITa' of the first interface film 220a.

The cross-sectional area of the second channel CH2 may be smaller than the cross-sectional area of the first channel CH1. The first interface film 220a may be formed by oxidizing part of the surface of the first channel CH1, and the second interface film 220b may be formed by oxidizing part of the surface of the second channel CH2. That is, as the thickness of an interface film disposed on a channel increases, the cross-sectional area of the channel may decrease. For example, a cross-sectional area S2 of the second channel CH2 along a direction perpendicular to the second direction X2 may be smaller than a cross-sectional area Si of the first channel CH1 along a direction perpendicular to the first direction X1.

The semiconductor device may include the first channel CH1, which has a relatively large cross-sectional area, in the first region I, and the second channel CH2, which has a relatively small cross-sectional area, in the second region II. Accordingly, the performance of the semiconductor device can be improved.

A channel having a large cross-sectional area can improve charge transfer characteristics, and a channel having a small cross-sectional area can improve turn-off characteristics.

That is, by forming channels having different cross-sectional areas in different regions, as necessary, the performance of the semiconductor device can be improved.

In some embodiments, the first and second gap-fill metals 260a and 260b may comprise different materials. For example, the first gap-fill metal 260a may comprise a material highly compatible with the first metal film 240a, and the second gap-fill metal 260b may comprise a material highly compatible with the second metal film 240b.

In some embodiments, the first and second substrates 200a and 200b may comprise semiconductor materials of different conductivity types. For example, the first substrate 200a may comprise an N-type semiconductor material, and the first channel CH1 may comprise a P-type semiconductor material. Accordingly, a P-channel metal oxide semiconductor (PMOS) transistor may be formed in the first region I. On the other hand, the second substrate 200b may comprise a P-type semiconductor material, and the second channel CH2 may comprise an N-type semiconductor material. Accordingly, an N-channel metal oxide semiconductor (NMOS) transistor may be formed in the second region II.

That is, the performance of the semiconductor device can be improved by forming interface films having different interface films or channels having different cross-sectional areas, as necessary.

A semiconductor device according to an example embodiment of the present disclosure will hereinafter be described with reference to FIGS. 14A through 14C. For convenience, descriptions of elements that have already been described above with reference to FIGS. 1 through 13C will be omitted, or at least simplified.

Figure 14A:
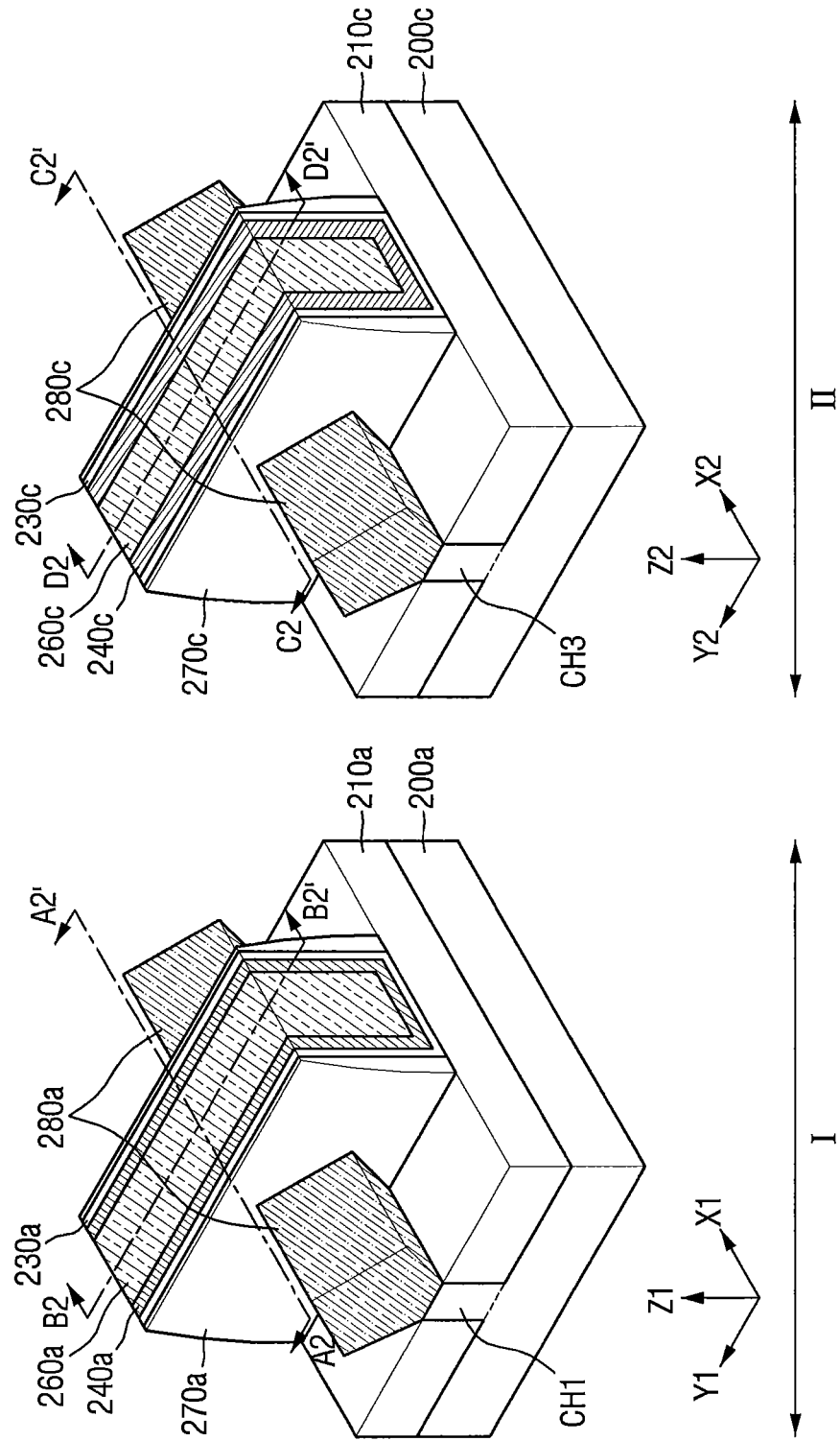
FIG. 14A is a perspective view of a semiconductor device according to an example embodiment of the present disclosure.

FIG. 14A is a perspective view of a semiconductor device according to an example embodiment of the present disclosure. FIG. 14B is a cross-sectional view taken along lines A2-A2' and C2-C2' of FIG. 14A. FIG. 14C is a cross-sectional view taken along lines B2-B2' and D2-D2' of FIG. 14A.

Figure 14B:
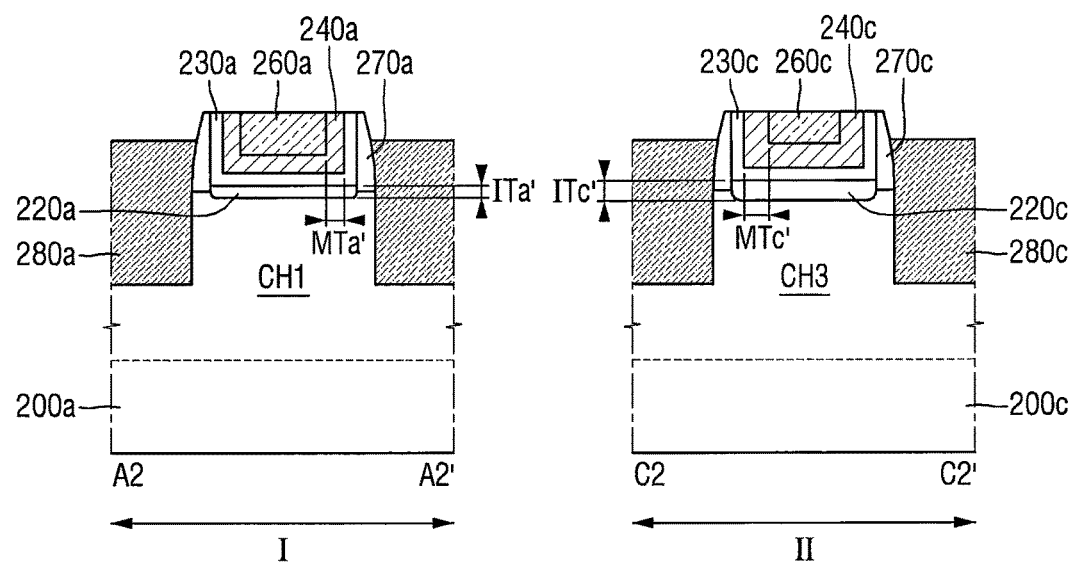
FIG. 14B is a cross-sectional view taken along lines A2-A2' and C2-C2' of FIG. 14A.
Figure 14C:
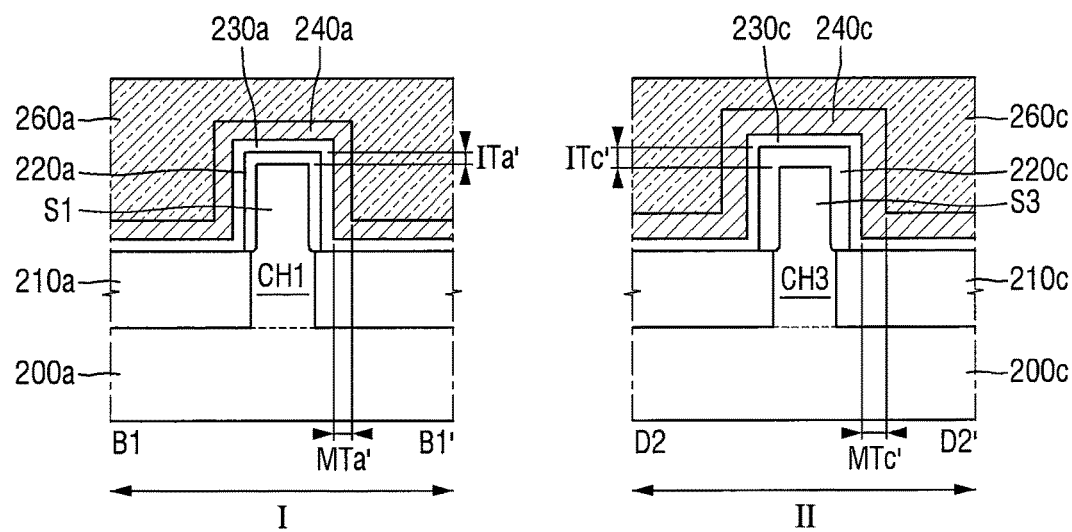
FIG. 14C is a cross-sectional view taken along lines B2-B2' and D2-D2' of FIG. 14A.

Referring to FIGS. 14A through 14C, the semiconductor device may include first and third substrates 200a and 200c, first and third isolation films 210a and 220c, first and third interface films 220a and 220c, first and third dielectric films 230a and 230c, first and third metal films 240a and 240c, first and third gap-fill metals 260a and 260c, first spacers 270a, third spacers 270c, first source/drain regions 280a, and third source/drain regions 280b.

The third interface film 220c may be disposed on a third channel CH3. Specifically, the third interface film 220c, instead of the second interface film 220b of FIG. 13A, may be disposed in a second region II to be interposed between the third channel CH3 and the third dielectric film 230c.

In some embodiments, the first and third interface films 220a and 220c may have different thicknesses. For example, a thickness ITc' of the third interface film 220c may be greater than a thickness ITa' of the first interface film 220a.

The third metal film 240c may be disposed on the third dielectric film 230c. Specifically, the third metal film 240c, instead of the second metal film 240b of FIG. 13A, may be disposed in the second region II to be interposed between the third dielectric film 230c and the third gap-fill metal 260c.

The first and third metal films 240a and 240c may have different oxygen contents in their natural oxidation state.

Specifically, the first metal film 240a may have a first oxygen content in its natural oxidation state, and the third metal film 240c may have a third oxygen content, which is greater than the first oxygen content, in its natural oxidation state.

In some embodiments, the first and third metal films 240a and 240c may have different thicknesses. For example, a thickness MTc' of the third metal film 240c may be greater than a thickness MTa' of the first metal film 240a. Accordingly, the third oxygen content may be greater than the first oxygen content.

Accordingly, the performance of the semiconductor device can be improved by forming interface films having different thicknesses in different regions, as necessary.

The cross-sectional area of the third channel CH3 may be smaller than the cross-sectional area of a first channel CH1. For example, a cross-sectional area S3 of the third channel CH3 along a direction perpendicular to a second direction X2 may be smaller than a cross-sectional area Si of the first channel CH1 along a direction perpendicular to a first direction X1.

That is, by forming channels having different cross-sectional areas in different regions, as necessary, the performance of the semiconductor device can be improved.

A semiconductor device according to an example embodiment of the present disclosure will hereinafter be described with reference to FIGS. 15A and 15B. For convenience, descriptions of elements that have already been described above with reference to FIGS. 1 through 14C will be omitted, or at least simplified.

Figure 15A:
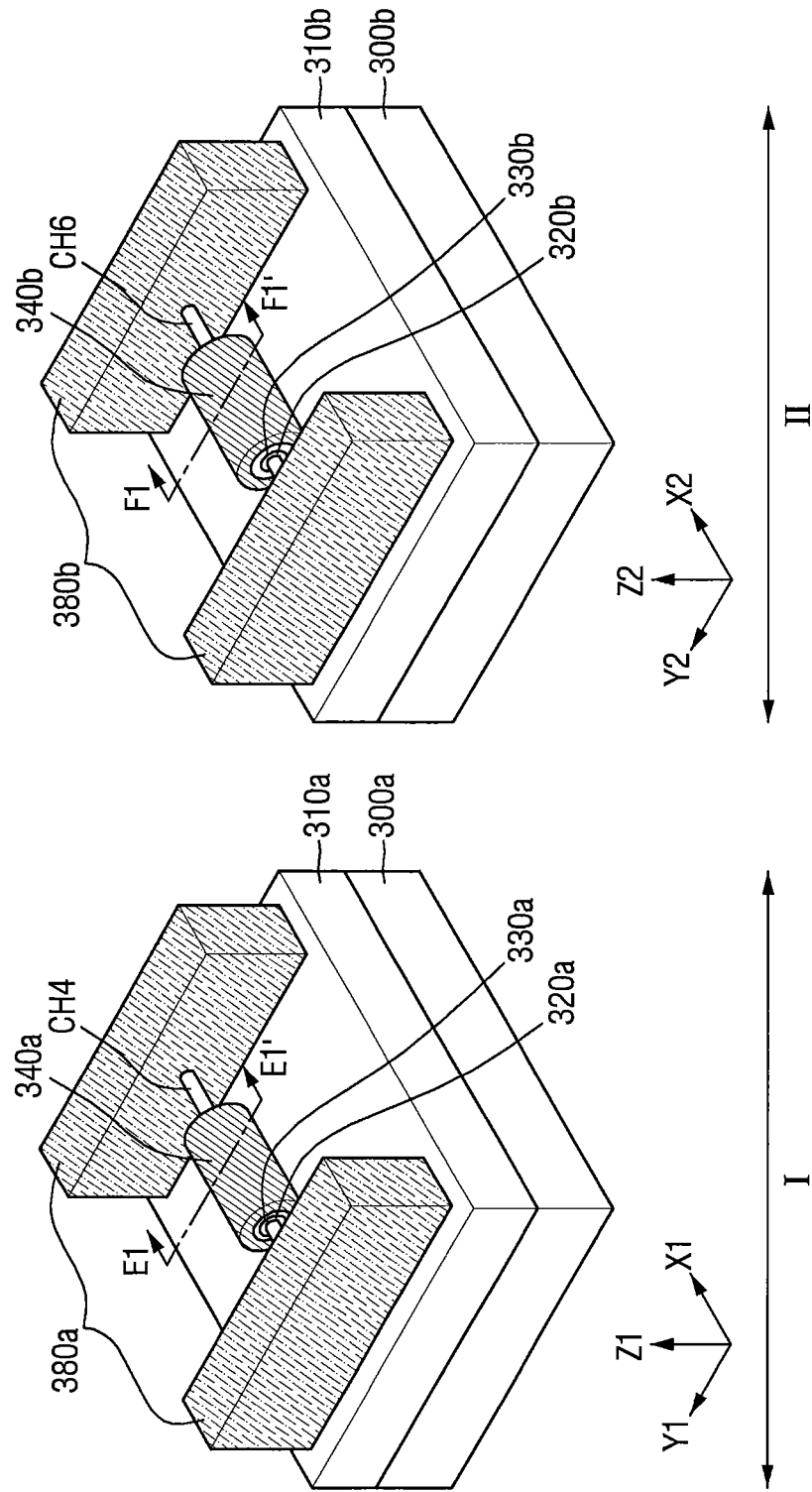
FIG. 15A is a perspective view of a semiconductor device according to an example embodiment of the present disclosure.

FIG. 15A is a perspective view of a semiconductor device according to an example embodiment of the present disclosure. FIG. 15B is a cross-sectional view taken along lines E1-E1' and F1-F1' of FIG. 15A.

Figure 15B:
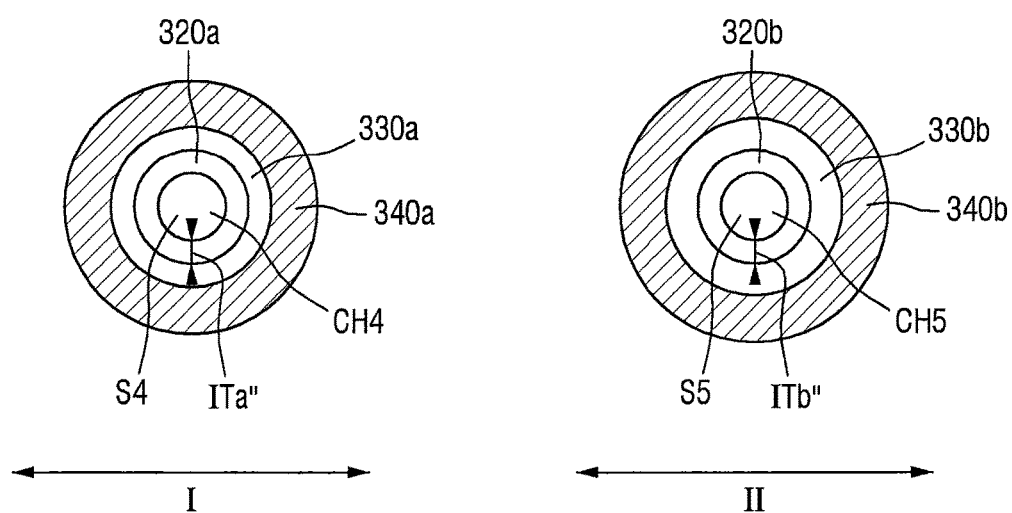
FIG. 15B is a cross-sectional view taken along lines E1-E1' and F1-F1' of FIG. 15A.

FIGS. 15A and 15B illustrate entire structures formed on first and second isolation films 310a and 310b except for an interlayer insulating film.

Referring to FIGS. 15A and 15B, the semiconductor device may include first and second substrates 300a and 300b, the first and second isolation films 310a and 310b, first and second interface films 320a and 320b, first and second dielectric films 330a and 330b, first and second metal films 340a and 340b, first source/drain regions 380a, and second source/drain regions 380b.

The first and second substrates 300a and 300b may include fourth and fifth channels CH4 and CH5, respectively. The fourth and fifth channels CH4 and CH5 may be in the shape of nanowires. For example, as illustrated in FIGS. 15A and 15B, the fourth and fifth channels CH4 and CH5 may be in the shape of wires. Each of the fourth and fifth channels CH4 and CH5 is illustrated in FIGS. 15A and 15B as including a single wire, but the present disclosure is not limited thereto. That is, each of the fourth and fifth channels CH4 and CH5 may include two or more wires.

The fourth channel CH4 may extend in a first direction X1 in a first region I. Similarly, the fifth channel CH5 may extend in a second direction X2 in a second region II.

The first dielectric film 330a and the first metal film 340a may surround the sides of the fourth channel CH4, which extends in the first direction X1. Similarly, the second dielectric film 330b and the second metal film 340b may surround the sides of the fifth channel CH5, which extends in the second direction X2.

The first source/drain regions 380a may be disposed on both sides of the fourth channel CH4 in the first direction X1. Similarly, the second source/drain regions 380b may be disposed on both sides of the fifth channel CH5 in the second direction X2.

The first source/drain regions 380a may be insulated from the first metal film 340a, and the second source/drain regions 380b may be insulated from the second metal film 340b.

The first source/drain regions 380a and the second source/drain regions 380b are illustrated in FIG. 15A as being cuboidal, but the present disclosure is not limited thereto.

The first and second metal films 340a and 340b may have different oxygen contents in their natural oxidation state. Specifically, the first metal film 340a may have a first oxygen content in its natural oxidation state, and the second metal film 340b may have a second oxygen content, which is greater than the first oxygen content, in its natural oxidation state.

In some embodiments, the first and second metal films 240a and 340b may comprise different materials. For example, the first metal film 340a may comprise TiN, and the second metal film 340b may comprise TaN. Accordingly, the second oxygen content may be greater than the first oxygen content.

As described above with reference to FIG. 1, the first and second interface films 320a and 320b may have different thicknesses. For example, a thickness ITb" of the second interface film 320b may be greater than a thickness ITa" of the first interface film 320a.

Accordingly, the performance of the semiconductor device can be improved by forming interface films having different thicknesses in different regions, as necessary.

The cross-sectional area of the fifth channel CH5 may be smaller than the cross-sectional area of the fourth channel CH4. For example, a cross-sectional area S5 of the fifth channel CH5 along a direction perpendicular to the second direction X2 may be smaller than a cross-sectional area S4 of the fourth channel CH4 along a direction perpendicular to the first direction X1.

That is, by forming channels having different cross-sectional areas in different regions, as necessary, the performance of the semiconductor device can be improved.

A semiconductor device according to an example embodiment of the present disclosure will hereinafter be described with reference to FIGS. 16A and 16B. For convenience, descriptions of elements that have already been described above with reference to FIGS. 1 through 15B will be omitted, or at least simplified.

Figure 16A:
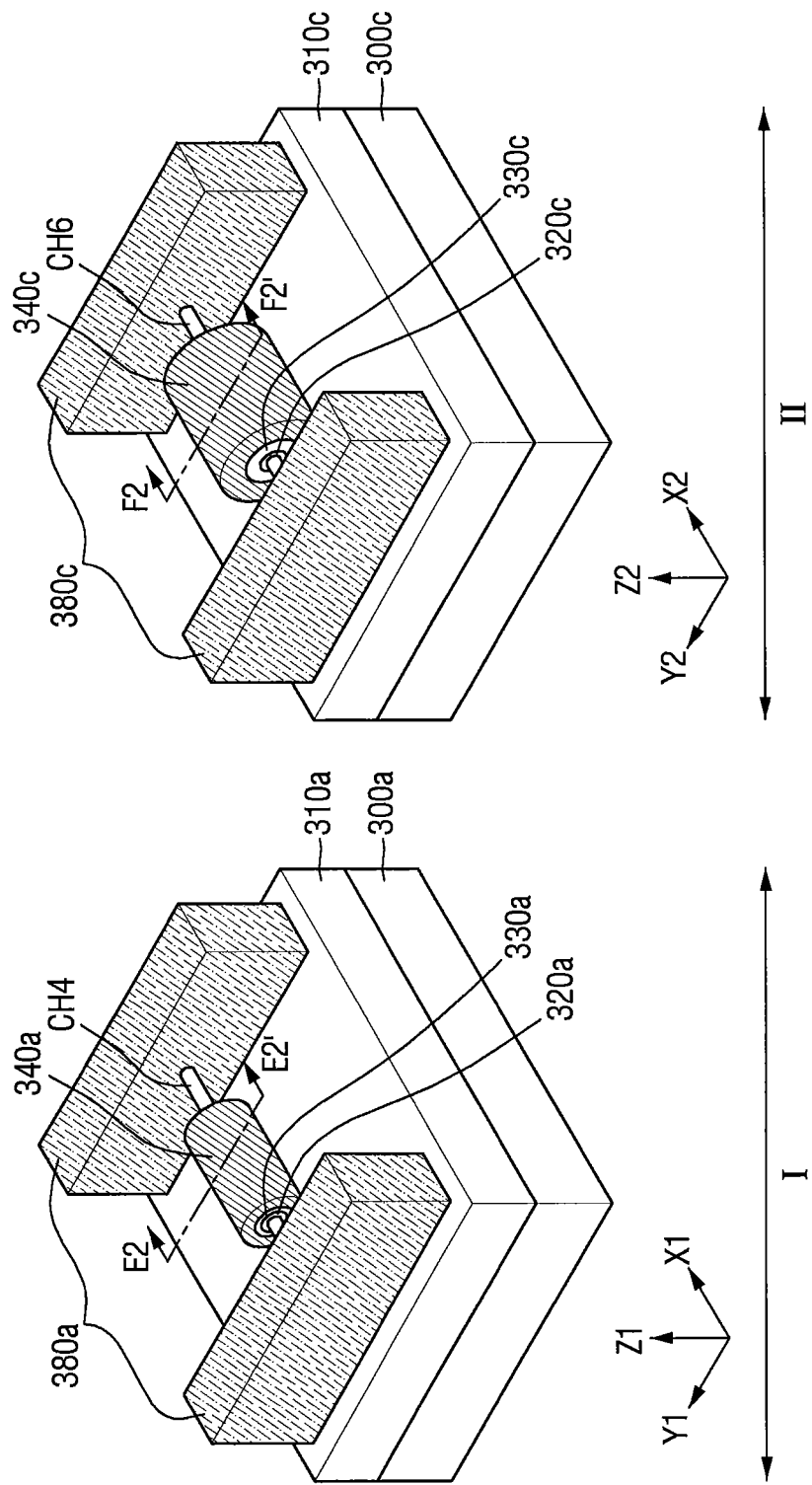
FIG. 16A is a perspective view of a semiconductor device according to an example embodiment of the present disclosure.

FIG. 16A is a perspective view of a semiconductor device according to an example embodiment of the present disclosure. FIG. 16B is a cross-sectional view taken along lines E2-E2' and F2-F2' of FIG. 16A.

Figure 16B:
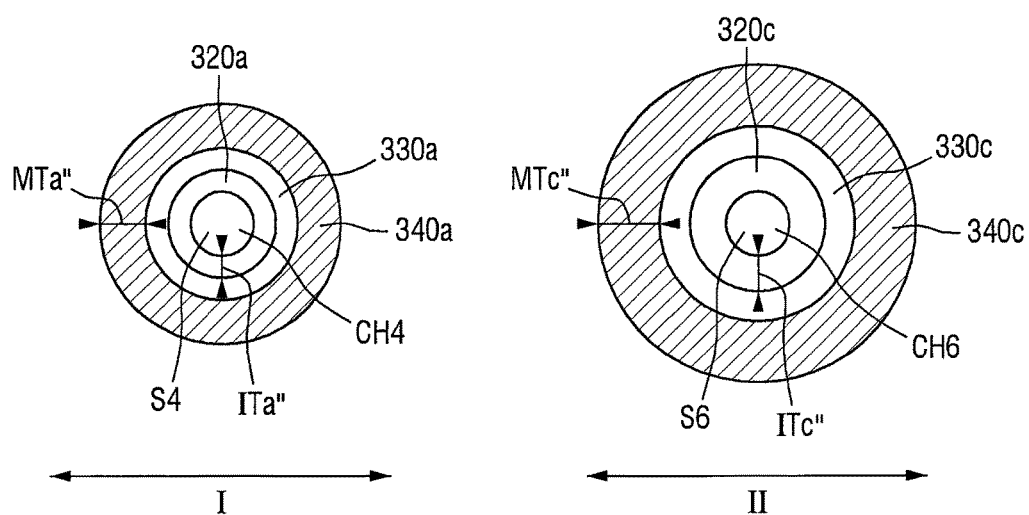
FIG. 16B is a cross-sectional view taken along lines E2-E2' and F2-F2' of FIG. 16A.

Referring to FIGS. 16A and 16B, the semiconductor device may include first and third substrates 300a and 300c, first and third isolation films 310a and 310c, first and third interface films 320a and 320c, first and third dielectric films 330a and 330c, first and third metal films 340a and 340c, first source/drain regions 380a, and third source/drain regions 380c.

The third interface film 320c may be disposed on a sixth channel CH6. Specifically, the third interface film 320c, instead of the second interface film 320b of FIG. 15A, may be disposed in a second region II to be interposed between the sixth channel CH6 and the third dielectric film 330c.

In some embodiments, the first and third interface films 320a and 320c may have different thicknesses. For example, a thickness ITc" of the third interface film 320c may be greater than a thickness ITa" of the first interface film 320a.

The third metal film 340c may be disposed on the third dielectric film 330c. Specifically, the third metal film 340c, instead of the second metal film 340b of FIG. 15A, may surround the third dielectric film 330c in the second region II.

The first and third metal films 340a and 340c may have different oxygen contents in their natural oxidation state. Specifically, the first metal film 340a may have a first oxygen content in its natural oxidation state, and the third metal film 340c may have a third oxygen content, which is greater than the first oxygen content, in its natural oxidation state.

In some embodiments, the first and third metal films 340a and 340c may have different thicknesses. For example, a thickness MTc" of the third metal film 340c may be greater than a thickness MTa" of the first metal film 340a. Accordingly, the third oxygen content may be greater than the first oxygen content.

Accordingly, the performance of the semiconductor device can be improved by forming interface films having different thicknesses in different regions, as necessary.

The cross-sectional area of the sixth channel CH6 may be smaller than the cross-sectional area of a fourth channel CH4. For example, a cross-sectional area S6 of the sixth channel CH6 along a direction perpendicular to a second direction X2 may be smaller than a cross-sectional area S4 of the fourth channel CH4 along a direction perpendicular to a first direction X1.

That is, by forming channels having different cross-sectional areas in different regions, as necessary, the performance of the semiconductor device can be improved.

A semiconductor device according to an example embodiment of the present disclosure will hereinafter be described with reference to FIGS. 17A through 17C. For convenience, descriptions of elements that have already been described above with reference to FIGS. 1 through 13C will be omitted, or at least simplified.

Figure 17A:
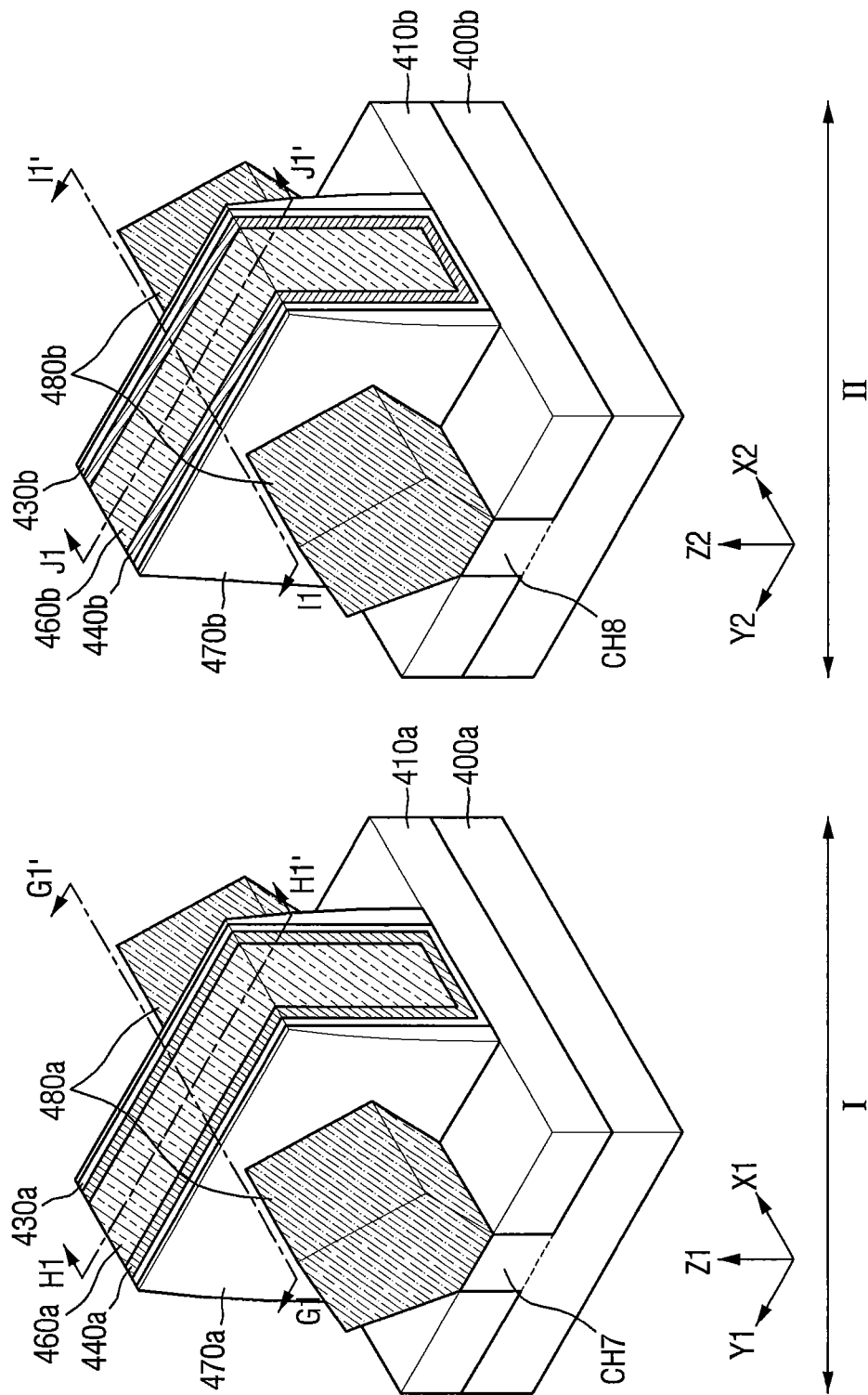
FIG. 17A is a perspective view of a semiconductor device according to an example embodiment of the present disclosure.

FIG. 17A is a perspective view of a semiconductor device according to an example embodiment of the present disclosure. FIG. 17B is a cross-sectional view taken along lines G1-G1' and I1-I1' of FIG. 17A. FIG. 17C is a cross-sectional view taken along lines H1-H1' and J1-J1' of FIG. 17A.

Figure 17B:
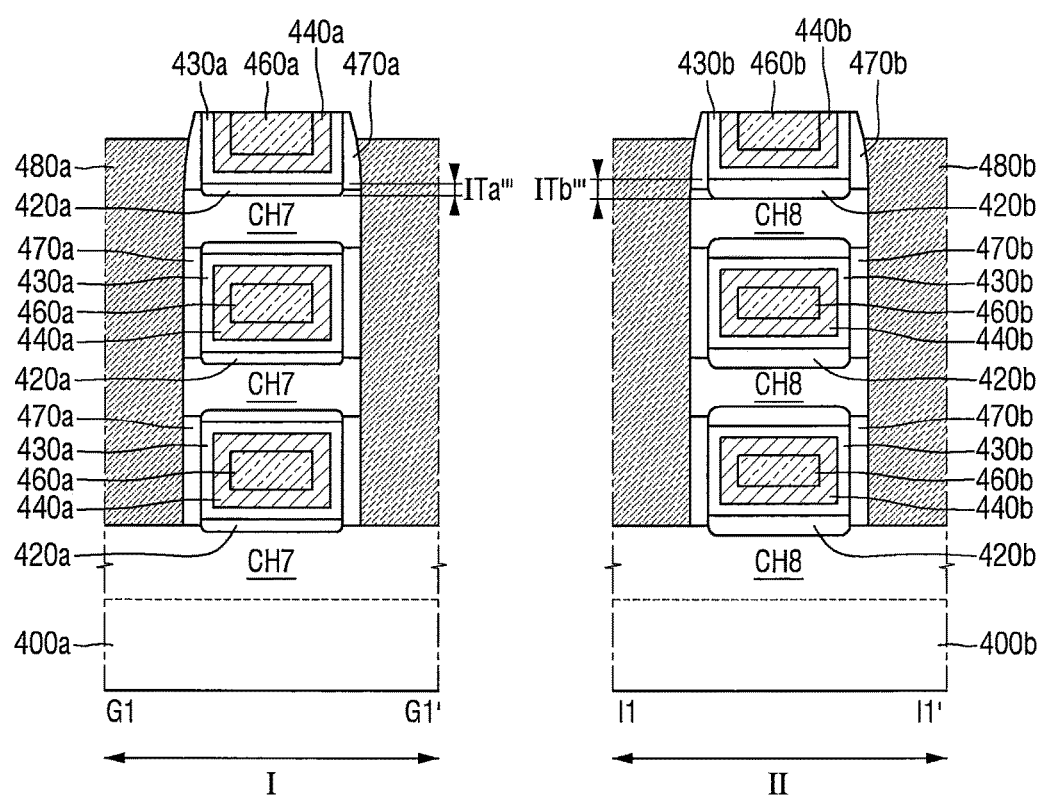
FIG. 17B is a cross-sectional view taken along lines G1-G1' and I1-I1' of FIG. 17A.
Figure 17C:
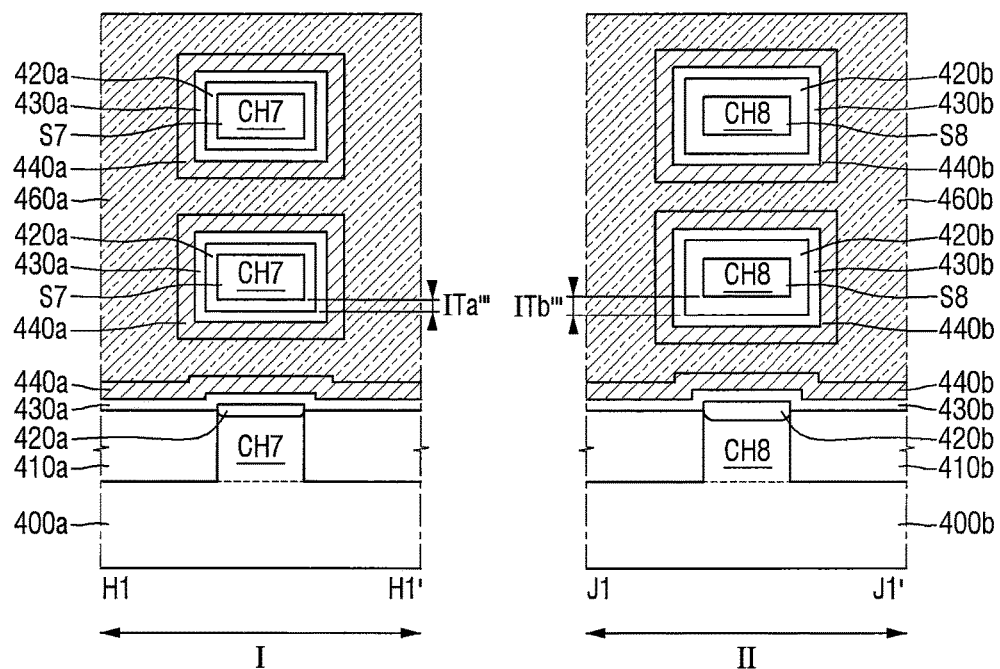
FIG. 17C is a cross-sectional view taken along lines H1-H1' and J1-J1' of FIG. 17A.

Referring to FIGS. 17A through 17C, the semiconductor device may include first and second substrates 400a and 400b, first and second isolation films 410a and 410b, first and second interface films 420a and 420b, first and second dielectric films 430a and 430b, first and second metal films 440a and 440b, first and second gap-fill metals 460a and 460b, first spacers 470a, second spacers 470b, first source/drain regions 480a, and second source/drain regions 480b.

The first and second substrates 400a and 400b may include seventh and eighth channels CH7 and CH8, respectively. The seventh and eighth channels CH7 and CH8 may be in the shape of nanosheets. For example, as illustrated in FIGS. 17A through 17C, each of the seventh and eighth channels CH7 and CH8 may include a plurality of sheets. Each of the seventh and eighth channels CH7 and CH8 is illustrated in FIGS. 17A through 17C as including two sheets, but the present disclosure is not limited thereto. That is, each of the seventh and eighth channels CH7 and CH8 may include three or more sheets.

The seventh channel CH7 may extend in a first direction X1 in a first region I. Similarly, the eighth channel CH8 may extend in a second direction X2 in a second region II.

The first interface film 420a may surround the sides of the seventh channel CH7, which extends in the first direction X1. That is, the first interface film 420a may surround a plurality of sheets that form the seventh channel CH7.

Similarly, the second interface film 420b may surround the sides of the eighth channel CH8, which extends in the second direction X2. That is, the second interface film 420b may surround a plurality of sheets that form the eighth channel CH8.

The first and second metal films 440a and 440b may have different oxygen contents in their natural oxidation state. Specifically, the first metal film 440a may have a first oxygen content in its natural oxidation state, and the second metal film 440b may have a second oxygen content, which is greater than the first oxygen content, in its natural oxidation state.

In some embodiments, the first and second metal films 440a and 440b may comprise different materials. For example, the first metal film 440a may comprise TiN, and the second metal film 440b may comprise TaN. Accordingly, the second oxygen content may be greater than the first oxygen content.

As described above with reference to FIG. 1, the first and second interface films 420a and 420b may have different thicknesses. For example, a thickness ITb''' of the second interface film 420b may be greater than a thickness ITa''' of the first interface film 420a.

The cross-sectional area of the eighth channel CH8 may be smaller than the cross-sectional area of the seventh channel CH7. For example, a cross-sectional area S8 of the eighth channel CH8 along a direction perpendicular to the second direction X2 may be smaller than a cross-sectional area S7 of the seventh channel CH7 along a direction perpendicular to the first direction X1.

That is, by forming channels having different cross-sectional areas in different regions, as necessary, the performance of the semiconductor device can be improved.

A semiconductor device according to an example embodiment of the present disclosure will hereinafter be described with reference to FIGS. 18A through 18C. For convenience, descriptions of elements that have already been described above with reference to FIGS. 1 through 14C will be omitted, or at least simplified.

Figure 18A:
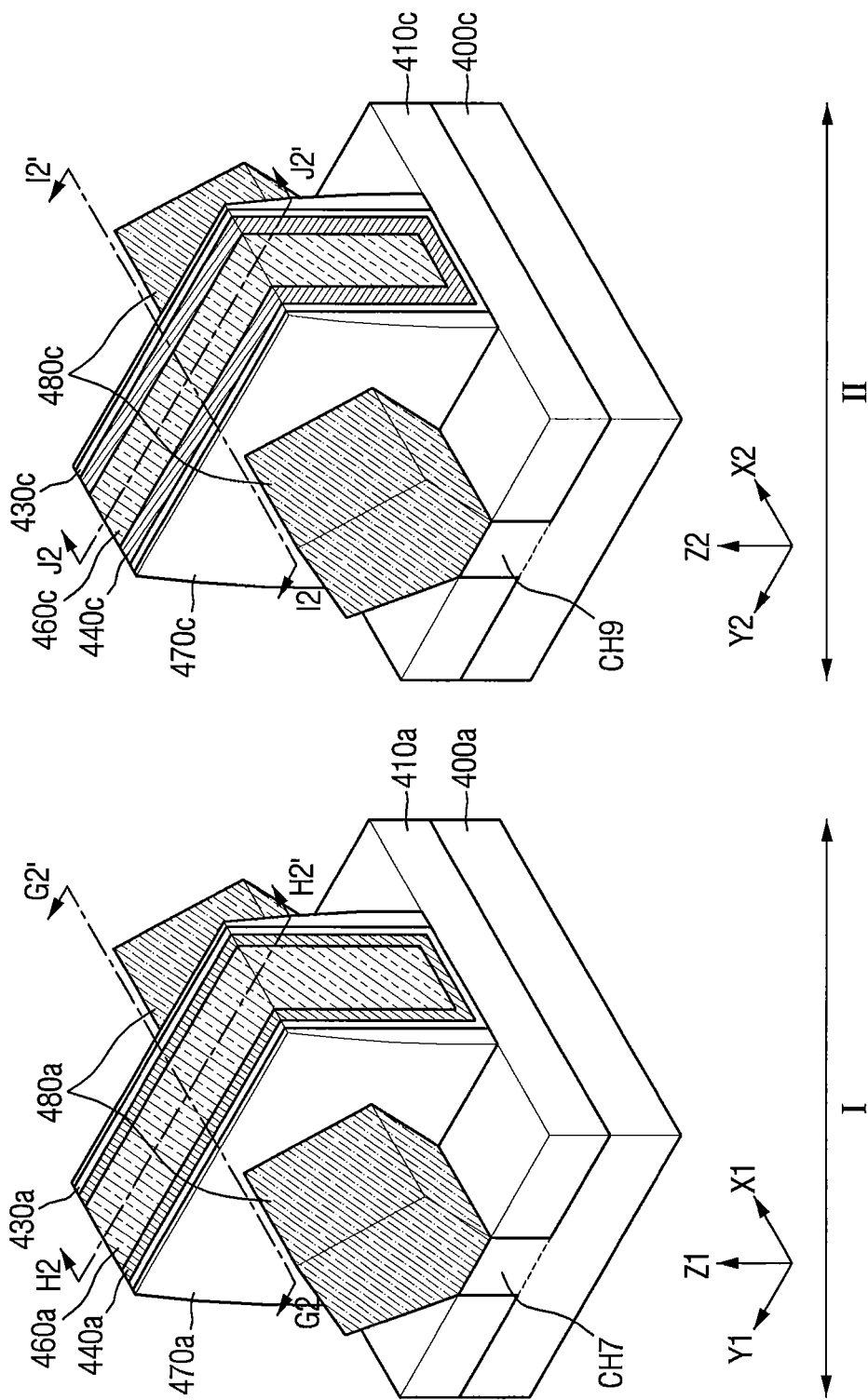
FIG. 18A is a perspective view of a semiconductor device according to an example embodiment of the present disclosure.

FIG. 18A is a perspective view of a semiconductor device according to an example embodiment of the present disclosure. FIG. 18B is a cross-sectional view taken along lines G2-G2' and I2-I2' of FIG. 18A. FIG. 18C is a cross-sectional view taken along lines H2-H2' and J2-J2' of FIG. 18A.

Figure 18B:
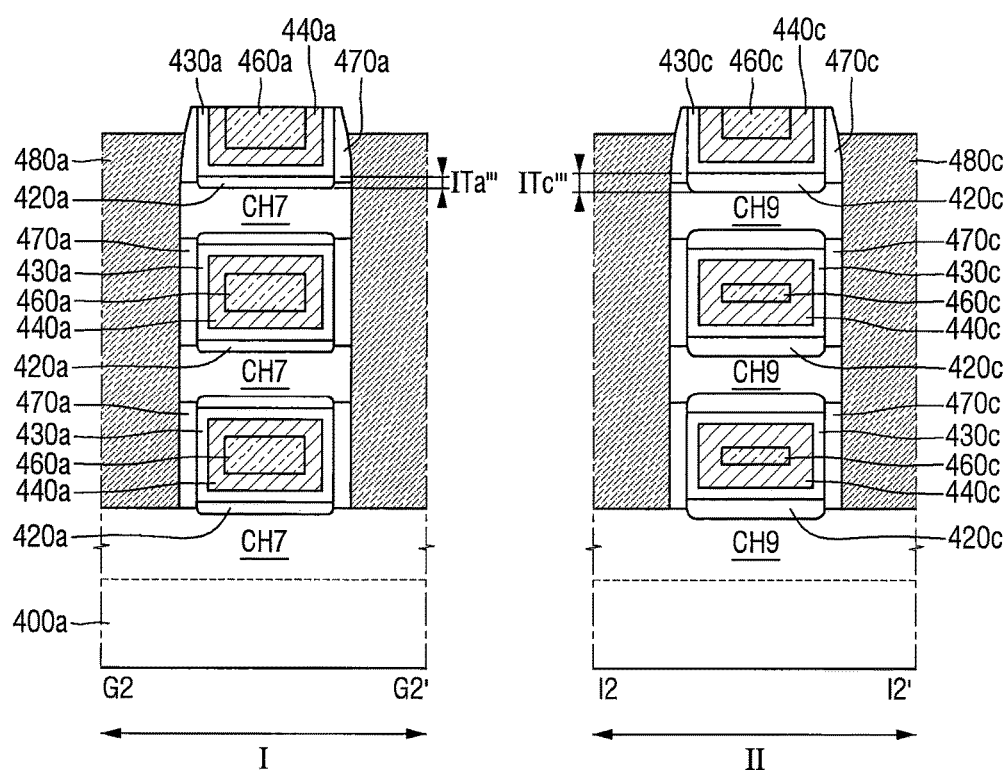
FIG. 18B is a cross-sectional view taken along lines G2-G2' and I2-I2' of FIG. 18A.
Figure 18C:
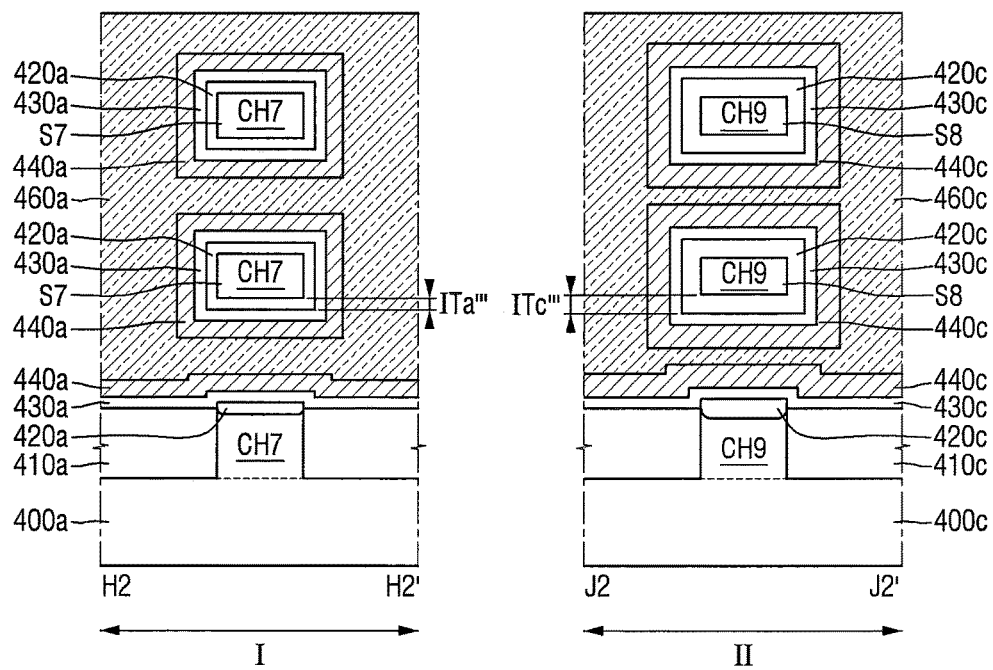
FIG. 18C is a cross-sectional view taken along lines H2-H2' and J2-J2' of FIG. 18A.

Referring to FIGS. 18A through 18C, the semiconductor device may include first and third substrates 400a and 400c, first and third isolation films 410a and 410c, first and third interface films 420a and 420c, first and third dielectric films 430a and 430c, first and third metal films 440a and 440c, first and third gap-fill metals 460a and 460c, first spacers 470a, third spacers 470c, first source/drain regions 480a, and third source/drain regions 480c.

The third interface film 420c may be disposed on a ninth channel CH9. Specifically, the third interface film 420c, instead of the second interface film 420b of FIG. 17A, may be disposed in a second region II to be interposed between the ninth channel CH9 and the third dielectric film 430c.

In some embodiments, the first and third interface films 420a and 420c may have different thicknesses. For example, a thickness ITc''' of the third interface film 420c may be greater than a thickness ITa''' of the first interface film 420a.

The third metal film 440c may be disposed on the third dielectric film 430c. Specifically, the third metal film 440c, instead of the second metal film 440b of FIG. 17A, may be disposed in the second region II to be interposed between the third dielectric film 430c and the third gap-fill metal 460c.

The first and third metal films 440a and 440c may have different oxygen contents in their natural oxidation state. Specifically, the first metal film 440a may have a first oxygen content in its natural oxidation state, and the third metal film 440c may have a third oxygen content, which is greater than the first oxygen content, in its natural oxidation state.

In some embodiments, the first and third metal films 440a and 440c may have different thicknesses. For example, a thickness MTc''' of the third metal film 440c may be greater than a thickness MTa''' of the first metal film 440a. Accordingly, the third oxygen content may be greater than the first oxygen content.

Accordingly, the performance of the semiconductor device can be improved by forming interface films having different thicknesses in different regions, as necessary.

The cross-sectional area of the ninth channel CH9 may be smaller than the cross-sectional area of a seventh channel CH7. For example, a cross-sectional area S9 of the ninth channel CH9 along a direction perpendicular to a second direction X2 may be smaller than a cross-sectional area S7 of the seventh channel CH7 along a direction perpendicular to a first direction X1.

That is, by forming channels having different cross-sectional areas in different regions, as necessary, the performance of the semiconductor device can be improved.

While the present disclosure has been particularly shown and described with reference to example embodiments thereof, it will be understood by those of ordinary skill in the art that various changes in form and details may be made therein without departing from the spirit and scope of the present disclosure as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device, comprising:
   a substrate including first and second regions;
   a first interface film disposed on the substrate in the first region;
   a second interface film disposed on the substrate in the second region;
   a dielectric film disposed on the first and second interface films;
   a first metal film disposed on the dielectric film in the first region; and
   a second metal film disposed on the dielectric film in the second region,
   wherein:
      the first and second interface films comprise an oxide of the substrate,
      the first and second metal films comprise different materials,
      the first and second interface films have different thicknesses,
      the substrate includes a first channel, which extends in a first direction, in the first region,
      the substrate includes a second channel, which extends in a second direction, in the second region, and
      a cross-sectional area of the second channel in a direction perpendicular to the second direction is different from a cross-sectional area of the first channel in a direction perpendicular to the first direction.

2. The semiconductor device of claim 1, wherein the substrate further includes first source/drain regions, which are disposed on both sides of the first channel in the first direction, and second source/drain regions, which are disposed on both sides of the second channel in the second direction, a first gap-fill metal, which is disposed on the first metal film, and a second gap-fill metal, which is disposed on the second metal film.

3. The semiconductor device of claim 1, wherein
   the first and second channels are fin-shaped and protrude from the substrate to extend in the first and second directions, respectively,
   the first interface film extends in a third direction, which intersects the first direction, to surround the first channel, and
   the second interface film extends in a fourth direction, which intersects the second direction, to surround the second channel.

4. The semiconductor device of claim 1, wherein
   the first and second channels are wire-shaped and extend in the first and second directions, respectively,
   the first interface film surrounds a side of the first channel extending in the first direction, and
   the second interface film surrounds a side of the second channel extending in the second direction.

5. The semiconductor device of claim 1, wherein
   the first channel includes a plurality of sheets extending in the first direction,
   the second channel includes a plurality of sheets extending in the second direction,
   the first interface film surrounds sides of the first channel extending in the first direction, and
   the second interface film surrounds sides of the second channel extending in the second direction.

6. The semiconductor device of claim 1, wherein
   the first metal film has a first oxygen content in its natural oxidation state,
   the second metal film has a second oxygen content in its natural oxidation state, and
   the second interface film is thicker than the first interface film.

7. The semiconductor device of claim 6, wherein
   the first metal film comprises titanium nitride (TiN), and
   the second metal film comprises tantalum nitride (TaN).

8. The semiconductor device of claim 1, wherein
   the first interface film has a thickness of 2 angstroms (Å) to 9 Å, and
   the second interface film has a thickness of 11 Å to 18 Å.

9. The semiconductor device of claim 1, wherein the substrate comprises semiconductor materials of different conductivity types in the first and second regions.

10. A semiconductor device, comprising:
   a substrate including first and second regions;
   a first interface film disposed on the substrate in the first region;
   a second interface film disposed on the substrate in the second region;
   a dielectric film disposed on the first and second interface films;
   a first metal film disposed on the dielectric film in the first region; and
   a second metal film disposed on the dielectric film in the second region,
   wherein:
      the first and second interface films comprise an oxide of the substrate, a thickness of the second metal film is greater than a thickness of the first metal film, a thickness of the second interface film is greater than a thickness of the first interface film, the substrate includes a first channel, which extends in a first direction, in the first region, the substrate includes a second channel, which extends in a second direction, in the second region, and a cross-sectional area of the second channel in a direction perpendicular to the second direction is different from a cross-sectional area of the first channel in a direction perpendicular to the first direction.

11. The semiconductor device of claim 10, wherein the first and second metal films have a thickness of 2 angstroms (Å) to 30 Å.

12. The semiconductor device of claim 11, wherein the first interface film has a thickness of 2 Å to 9 Å, the second interface film is 9 Å to 11 Å thicker than the first interface film, and the second metal film is 14 Å to 16 Å thicker than the first metal film.

13. A semiconductor device, comprising:

a substrate including first and second regions, wherein the first region comprises a first conductivity type and the second region comprises a second conductivity type;

first and second interface films of different thicknesses comprising an oxide of the substrate and respectively disposed in the first and second regions;

a dielectric film disposed on the first and second interface films; and first and second metal films of different thicknesses disposed on the dielectric film, the first and second metal films having different oxygen content, the first metal film disposed on the dielectric film in the first region and the second metal film disposed on the dielectric film in the second region, wherein the substrate includes a first channel extending in a first direction, wherein the substrate includes a second channel extending in a second direction, and wherein a cross-sectional area of the second channel in a direction perpendicular to the second direction is different from a cross-sectional area of the first channel in a direction perpendicular to the first direction.

14. The semiconductor device of claim 13, wherein the second interface film is thicker than the first interface film.

15. The semiconductor device of claim 13, wherein the first and second metal films have a thickness of 2 angstroms (Å) to 30 Å.

16. The semiconductor device of claim 13, wherein the first channel is in the first region and wherein the second channel is in the second region.

* * * * *